(12) United States Patent
Kubota

(10) Patent No.: US 10,153,330 B2
(45) Date of Patent: Dec. 11, 2018

(54) ELECTRO-OPTICAL DEVICE AND ELECTRONIC APPARATUS HAVING AN EVALUATION PATTERN

(71) Applicant: SEIKO EPSON CORPORATION, Tokyo (JP)

(72) Inventor: Naotaka Kubota, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/415,639

(22) Filed: Jan. 25, 2017

(65) Prior Publication Data

US 2017/0236879 A1  Aug. 17, 2017

(30) Foreign Application Priority Data

Feb. 12, 2016 (JP) .................. 2016-024504

(51) Int. Cl.
| | |
|---|---|
| *H01L 29/20* | (2006.01) |
| *H01L 21/00* | (2006.01) |
| *H01L 27/32* | (2006.01) |
| *H01L 51/50* | (2006.01) |
| *G02B 27/01* | (2006.01) |
| *H01L 51/00* | (2006.01) |
| *H01L 51/52* | (2006.01) |
| *G02B 5/20* | (2006.01) |
| *G09G 3/3225* | (2016.01) |
| *G09G 3/3208* | (2016.01) |

(52) U.S. Cl.
CPC .......... *H01L 27/3209* (2013.01); *G02B 5/201* (2013.01); *G02B 27/017* (2013.01); *G02B 27/0172* (2013.01); *G09G 3/3225* (2013.01); *H01L 27/3206* (2013.01); *H01L 51/0031* (2013.01); *H01L 51/5012* (2013.01); *H01L 51/5265* (2013.01); *G02B 2027/0112* (2013.01); *G02B 2027/0134* (2013.01); *G02B 2027/0178* (2013.01); *G09G 3/3208* (2013.01); *G09G 2300/0426* (2013.01); *H01L 27/322* (2013.01)

(58) Field of Classification Search
CPC ............ H01L 27/3206; H01L 51/0031; H01L 51/5265; H01L 51/5012; H01L 27/3209; H01L 27/322; G02B 27/0172; G02B 5/201
See application file for complete search history.

(56) References Cited

U.S. PATENT DOCUMENTS

| | | | |
|---|---|---|---|
| 6,552,488 B1 | 4/2003 | Roitman et al. | |
| 2013/0222896 A1 | 8/2013 | Komatsu et al. | |
| 2014/0042408 A1* | 2/2014 | Akagawa | H01L 51/5253 257/40 |
| 2014/0117842 A1* | 5/2014 | Hanamura | H01L 27/322 313/504 |
| 2017/0236876 A1* | 8/2017 | Akagawa | H01L 27/322 438/29 |

FOREIGN PATENT DOCUMENTS

| | | |
|---|---|---|
| JP | 2001-126864 A | 5/2001 |
| JP | 2013-200553 A | 10/2013 |
| JP | 2014-089804 A | 5/2014 |

\* cited by examiner

*Primary Examiner* — Alonzo Chambliss
(74) *Attorney, Agent, or Firm* — Oliff PLC

(57) ABSTRACT

An organic EL device includes a substrate; an organic EL element that is disposed on the substrate; a sealing part that is formed to cover the organic EL element; a color filter that includes coloring layers formed on the sealing part; and a dimension evaluation pattern for evaluating dimensional accuracy of the color filter.

20 Claims, 14 Drawing Sheets

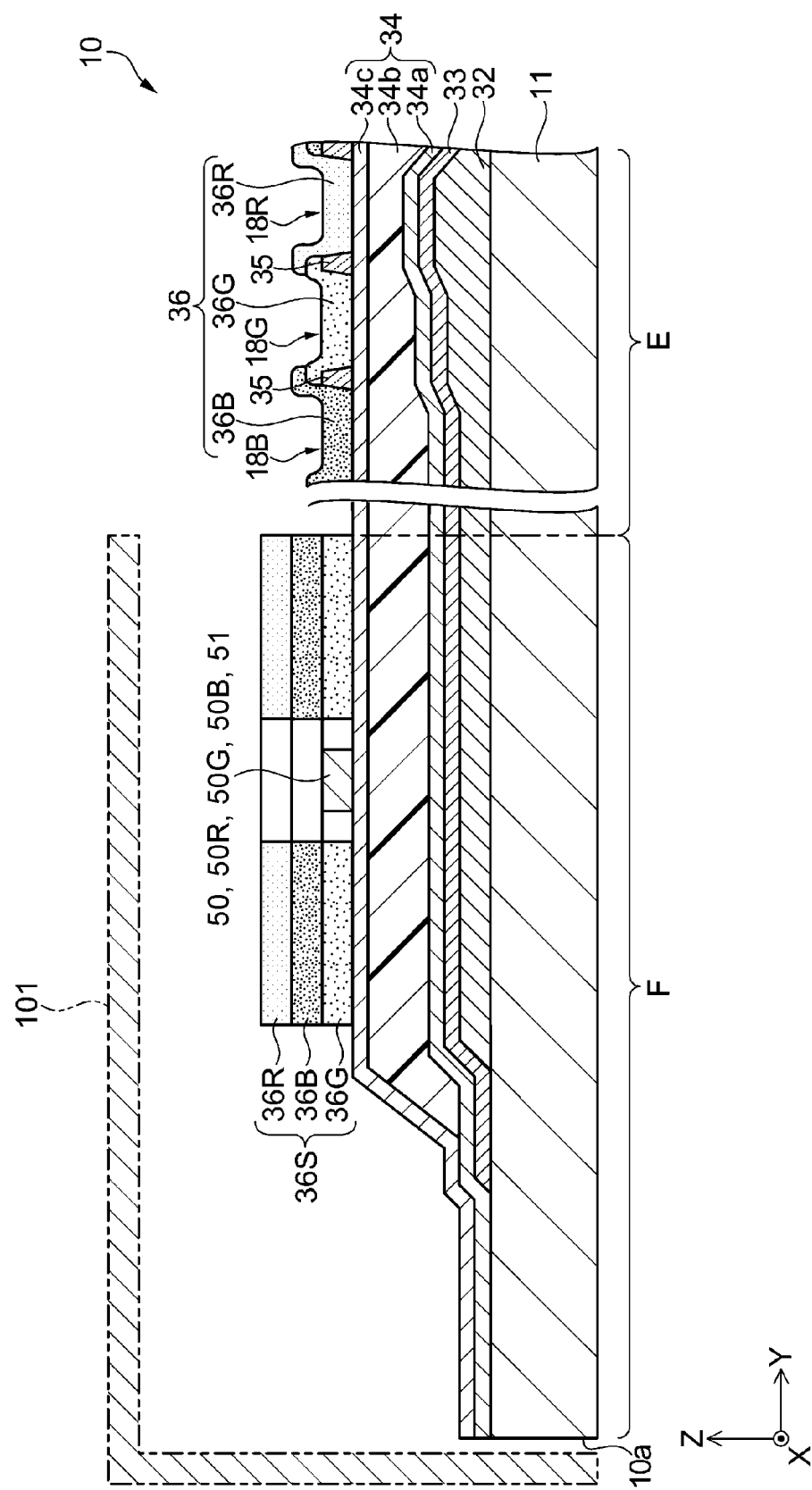

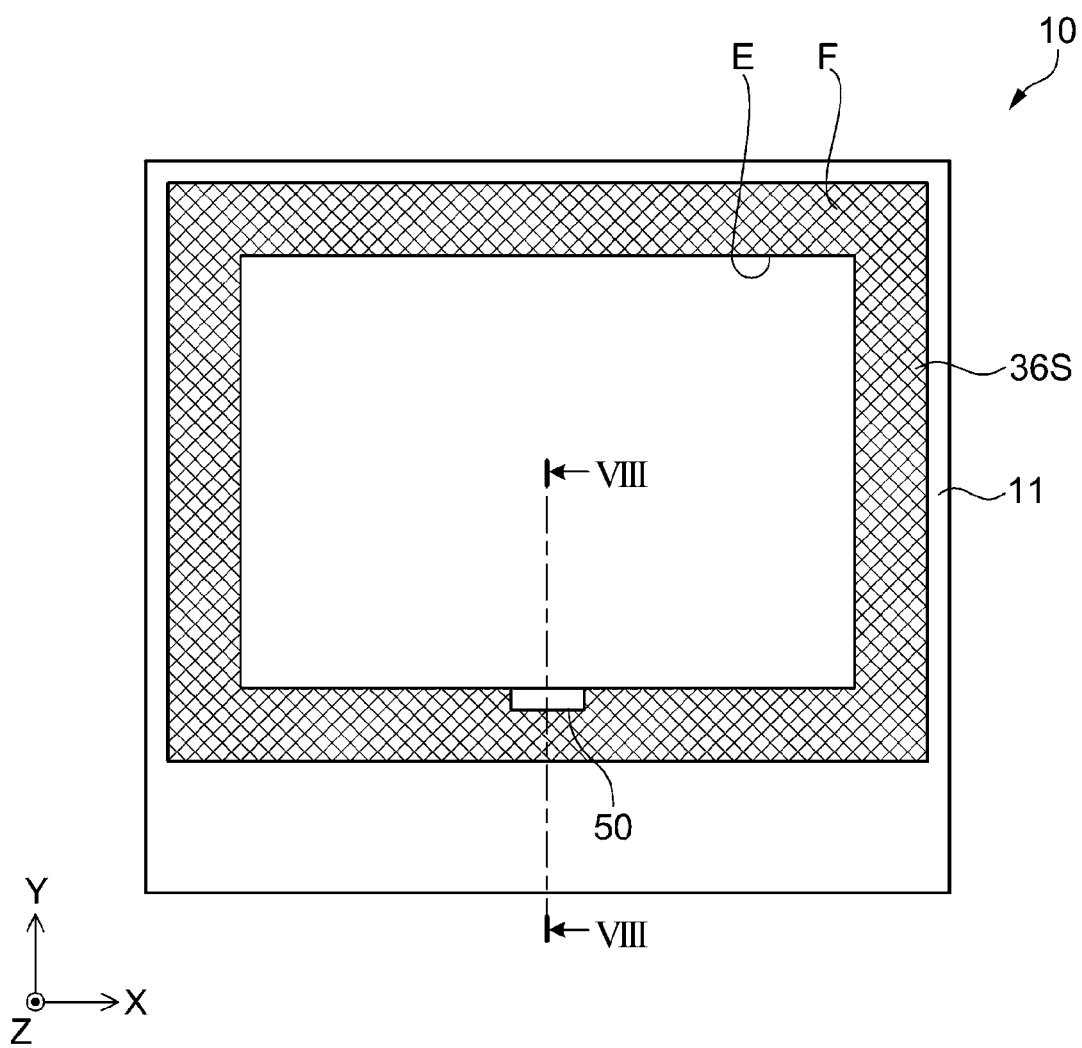

ELECTRO-OPTICAL DEVICE AND ELECTRONIC APPARATUS HAVING AN EVALUATION PATTERN

BACKGROUND

1. Technical Field

The present invention relates to an electro-optical device including an organic electroluminescence (EL) element and an electronic apparatus.

2. Related Art

Since an organic EL element as a luminescence element is able to be miniaturized and thinner than a light emitting diode (LED), applications to a microdisplay such as a head mount display (HMD), an electronic view finder (EVF), and the like have been noted. As means for realizing a color display in such a microdisplay, a configuration combining the organic EL element from which white light luminance can be obtained and a color filter has been proposed (see, for example, JP-A-2014-089804).

In an electro-optical device (organic EL device) of JP-A-2014-089804, a sealing part is formed to cover a plurality of organic EL elements which are disposed on a substrate and the color filter that is configured to have coloring layers of red (R), green (G), and blue (B) is formed on the sealing part using a photolithography method. The coloring layers constituting the color filter are divided by a convex portion of which a height from a sealing layer is lower than that of the coloring layer. Thus, edge portions of the coloring layers adjacent to each other are in contact with each other or one edge portion of the coloring layers overlaps another edge portion.

By the way, in order to obtain excellent viewing angle characteristic in the electro-optical device, it is necessary to form the coloring layer constituting the color filter more accurately for each of the organic EL elements. Accordingly, it is desirable to perform control of management characteristics (for example, dimension, position, and the like) of each of the coloring layers more accurately in a manufacturing process of the color filter. However, in the case where edge portions of the coloring layers adjacent to each other are in contact with each other or one edge portion of the coloring layers overlaps another edge portion, there is a problem that it is difficult to measure the dimension and the position of each of the coloring layers accurately.

SUMMARY

The invention can be realized in the following aspects or application examples.

Application Example 1

According to this application example, there is provided an electro-optical device including a substrate; an organic EL element that is disposed on the substrate; a sealing part that is formed to cover the organic EL element; a color filter that includes a coloring layer formed on the sealing part; and an evaluation pattern for evaluating the color filter.

The electro-optical device according to the application example includes the evaluation pattern for evaluating the color filter in addition to the color filter including the coloring layers formed on the sealing part covering the organic EL elements. For this reason, according to a configuration of the application example, it is possible to perform a control of management characteristics of the coloring layer constituting the color filter by measuring the evaluation pattern in the manufacturing process of the color filter. Accordingly, since the coloring layer constituting the color filter can be more accurately formed with respect to the organic EL element, the electro-optical device having excellent display characteristic with good viewing angle characteristics can be provided.

Application Example 2

In the electro-optical device according to the application example, the sealing part is preferably formed over a first area on which the organic EL element is disposed and a second area surrounding the first area, the color filter is preferably disposed on the sealing part in the first area, and the evaluation pattern is preferably disposed on the sealing part in the second area.

According to the configuration of the application example, since the evaluation pattern is disposed on the sealing part in the same manner as the color filter, the evaluation pattern can be formed in condition more similar to that of the color filter as compared with a case where the evaluation pattern is not formed on the sealing part. Also, since the evaluation pattern is disposed in the second area surrounding the first area in which the organic EL element is disposed, light generated by the organic EL element is emitted without a hindrance of the dimension evaluation pattern.

Application Example 3

In the electro-optical device according to the application example, the evaluation pattern preferably includes a dimension evaluation pattern for evaluating dimensional accuracy.

According to the configuration of the application example, the dimensional accuracy of the coloring layer can be measured by the dimension evaluation pattern which is included in the evaluation pattern. Accordingly, it is possible to perform the control of the dimension of the coloring layer more accurately in the manufacturing process of the color filter.

Application Example 4

In the electro-optical device according to the application example, it is preferable that a height of the sealing part from the first area on the substrate be approximately equal to a height of the sealing part from the second area on the substrate.

According to the configuration of the application example, a height of the sealing part on which the dimension evaluation pattern is disposed from the substrate is approximately equal to a height of the sealing part on which the color filter is disposed from the substrate. For this reason, for example, since the color filter and the dimension evaluation pattern are disposed at substantially the same position (distance) from the focal point of exposure equipment when the coloring layer of the color filter is formed using the photolithography method, the dimension evaluation pattern can be formed in more similar accuracy as the color filter. Thus, it is possible to perform the control of the dimension of the coloring layer constituting the color filter more accurately by measuring the dimension evaluation pattern.

Application Example 5

In the electro-optical device according to the application example, the evaluation pattern is preferably disposed near the first area in the second area.

According to the configuration of the application example, since the evaluation pattern is disposed at a position near the first area on which the plurality of organic EL elements are disposed and formed in condition more similar to the color filter, the dimensions and the shapes between the differences of the dimension evaluation pattern and the color filter are less likely to occur.

Application Example 6

In the electro-optical device according to the application example, the evaluation pattern preferably includes a position evaluation pattern for evaluating position accuracy.

According to the configuration of the application example, the position accuracy of the coloring layer can be measured by the position evaluation pattern which is included in the evaluation pattern. Accordingly, it is possible to perform the control of the position of the coloring layer more accurately in the manufacturing process of the color filter.

Application Example 7

In the electro-optical device according to the application example, the position evaluation pattern is preferably disposed at a corner portion of an outer peripheral in the second area.

According to the configuration of the application example, since the position evaluation pattern is disposed at the corner portion of the outer periphery in the second area, it is possible to recognize, for example, a status of the entire positional deviation inside of a surface of the electro-optical device.

Application Example 8

In the electro-optical device according to the application example, the evaluation pattern preferably includes the coloring layers of at least two colors, the color filter preferably includes the coloring layers of at least two colors, the coloring layers of at least two colors are preferably formed to overlap each other, and the coloring layers of at least two colors of the evaluation pattern are preferably formed to be apart from each other.

According to the configuration of the application example, since the color filter is configured to have the coloring layers of at least two colors which are formed to partially overlap each other, it is difficult to measure accurately the dimensions and the positions of the coloring layers constituting the color filter. On the other hand, since the evaluation pattern is configured to have the coloring layers of at least two colors which are formed to be apart from each other, it is possible to measure accurately the dimensions and the positions of the coloring layers constituting the evaluation pattern. Thus, even in the case where the coloring layers constituting the color filter are formed to overlap each other, it is possible to perform the control of the dimension and the position of the color filter more accurately by measuring the evaluation pattern in the manufacturing process of the color filter.

Application Example 9

In the electro-optical device according to the application example, the evaluation pattern preferably includes a plurality of patterns for each of the coloring layers.

According to the configuration of the application example, since the coloring layer constituting the evaluation pattern includes the plurality of patterns, deformation and loss of the patterns are suppressed at the time of exposure and development as compared with a case where the coloring layer includes only one pattern.

Application Example 10

In the electro-optical device according to the application example, one pattern among the plurality of patterns is preferably different from the other patterns.

According to the configuration of the application example, since one pattern among the plurality of patterns is different from the other patterns, it is possible to identify a specific pattern among the plurality of patterns or recognize the positional deviation of each of the coloring layers by comparing the different patterns with each other.

Application Example 11

The electro-optical device according to the application example further includes a casing unit that has light shielding properties, in which the evaluation patterns are preferably covered with the casing unit.

According to the configuration of the application example, since the evaluation pattern is covered with the casing unit, light which passes through the evaluation pattern is shielded by the casing unit and is not visible to the outside. Thus, even in the case where the evaluation pattern is provided, display quality of the electro-optical device is not decreased.

Application Example 12

According to this application example, there is provided an electronic apparatus including the electro-optical device described in the application example.

According to configurations of the application example, it is possible to provide the electronic apparatus having the excellent display quality.

BRIEF DESCRIPTION OF THE DRAWINGS

The invention will be described with reference to the accompanying drawings, wherein like numbers reference like elements.

FIG. 6 is a schematic cross-sectional view illustrating disposition of the dimension evaluation pattern taken along line VI-VI in FIG. 5A.

FIG. 7 is a schematic plan view of an element substrate showing disposition of an evaluation pattern according to Example 2.

DESCRIPTION OF EXEMPLARY EMBODIMENTS

Hereinafter, embodiments according to the invention will be described with reference to drawings. Furthermore, the drawings used may be appropriately enlarged or reduced in order to display parts to be described in a recognizable state.

Furthermore, in the following embodiments, meaning referred to as "on a substrate" includes, unless specifically noted, a case in which an element is disposed to be in contact with the substrate, a case in which the element is disposed on the substrate via another construct, and a case in which a part of the element is disposed in contact on the substrate and the other part is disposed on the substrate via other construct.

First Embodiment

Organic EL Device

Figure 1:
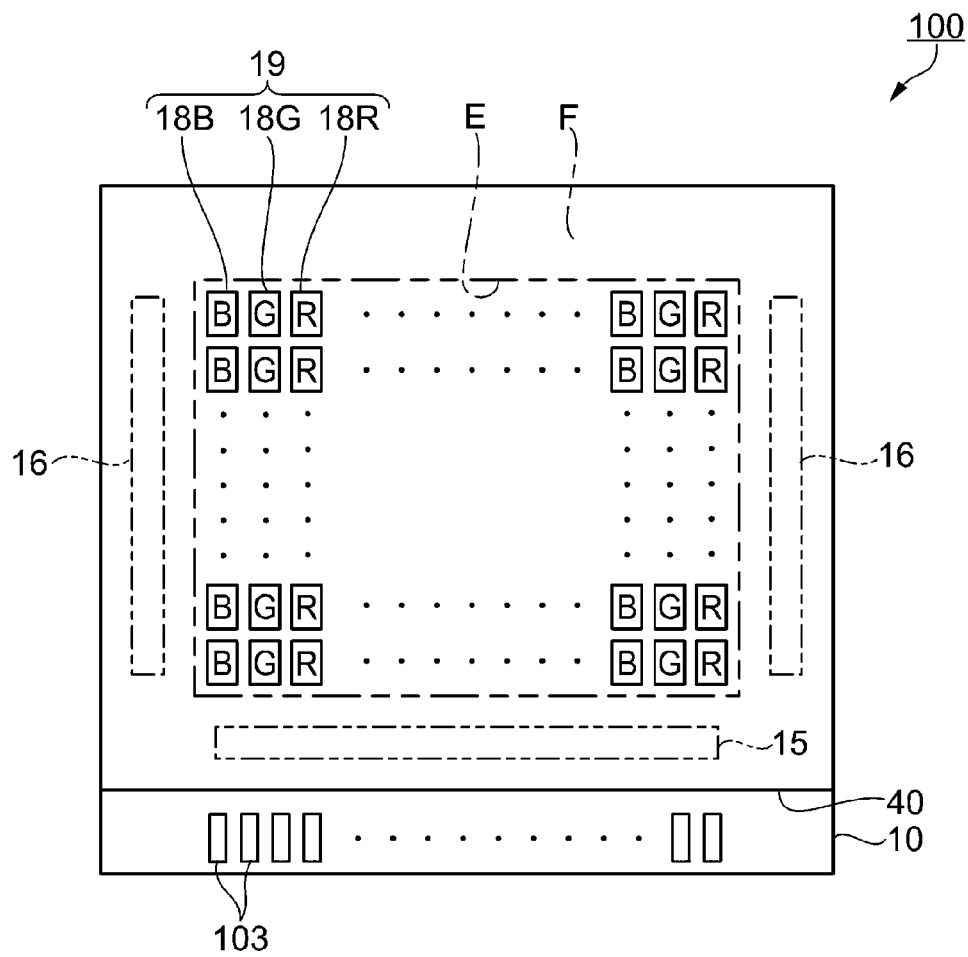
FIG. 1 is a schematic plan view illustrating a configuration of an organic EL device according to a first embodiment.
Figure 2:
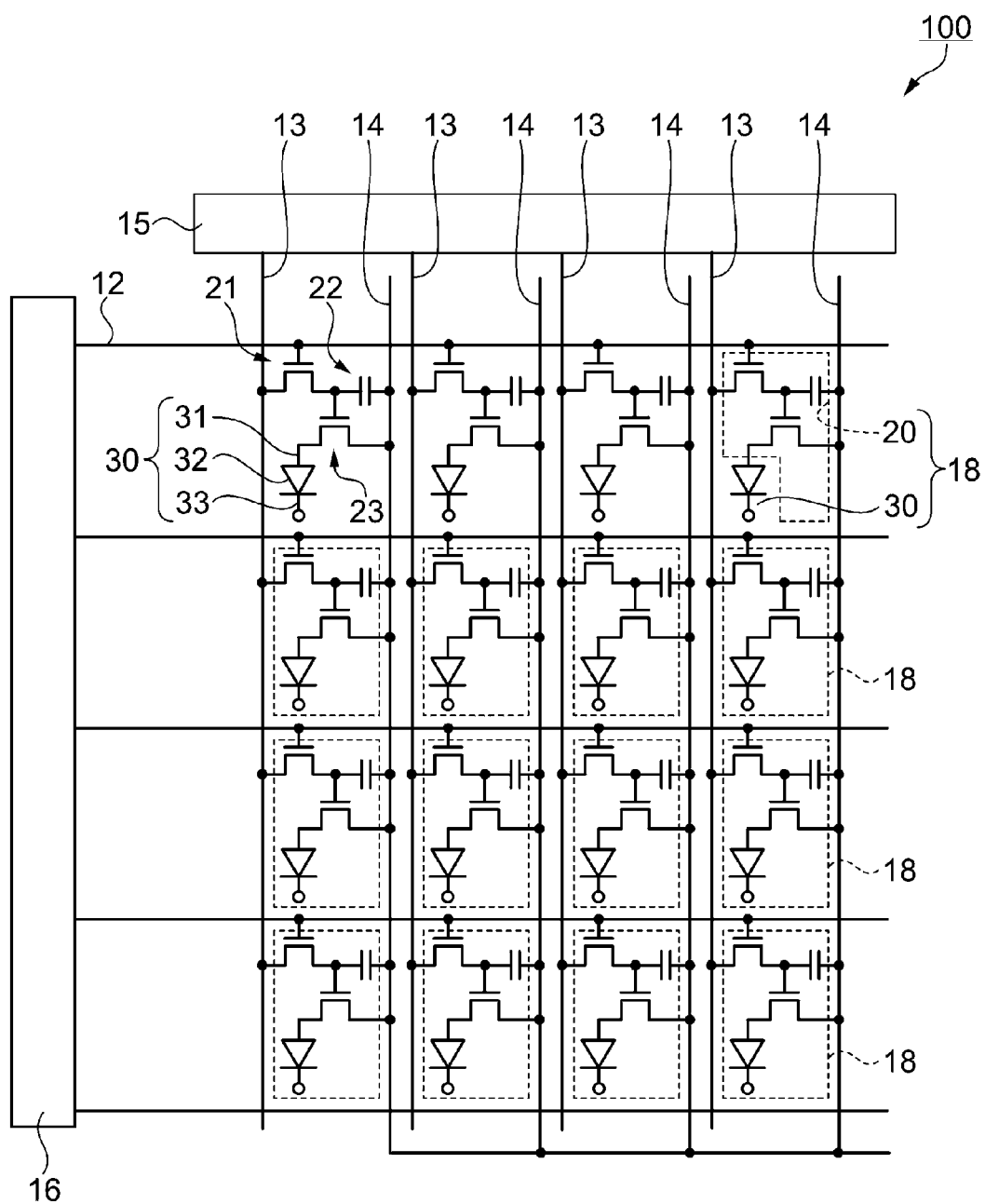
FIG. 2 is an equivalent circuit diagram illustrating an electrical configuration of the organic EL device according to the first embodiment.
Figure 3:
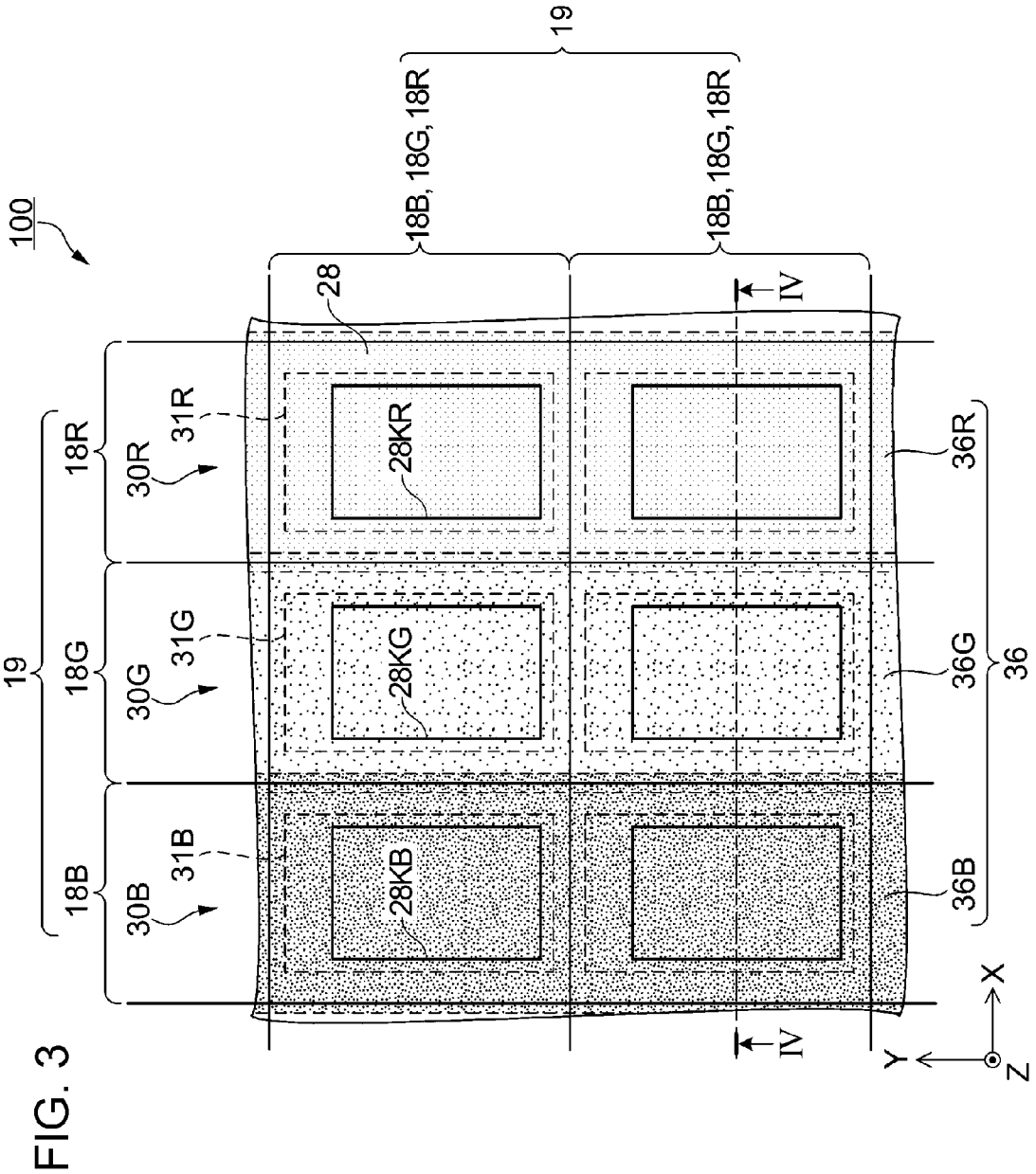
FIG. 3 is a schematic plan view illustrating disposition of an organic EL element and a color filter in a sub pixel.
Figure 4:
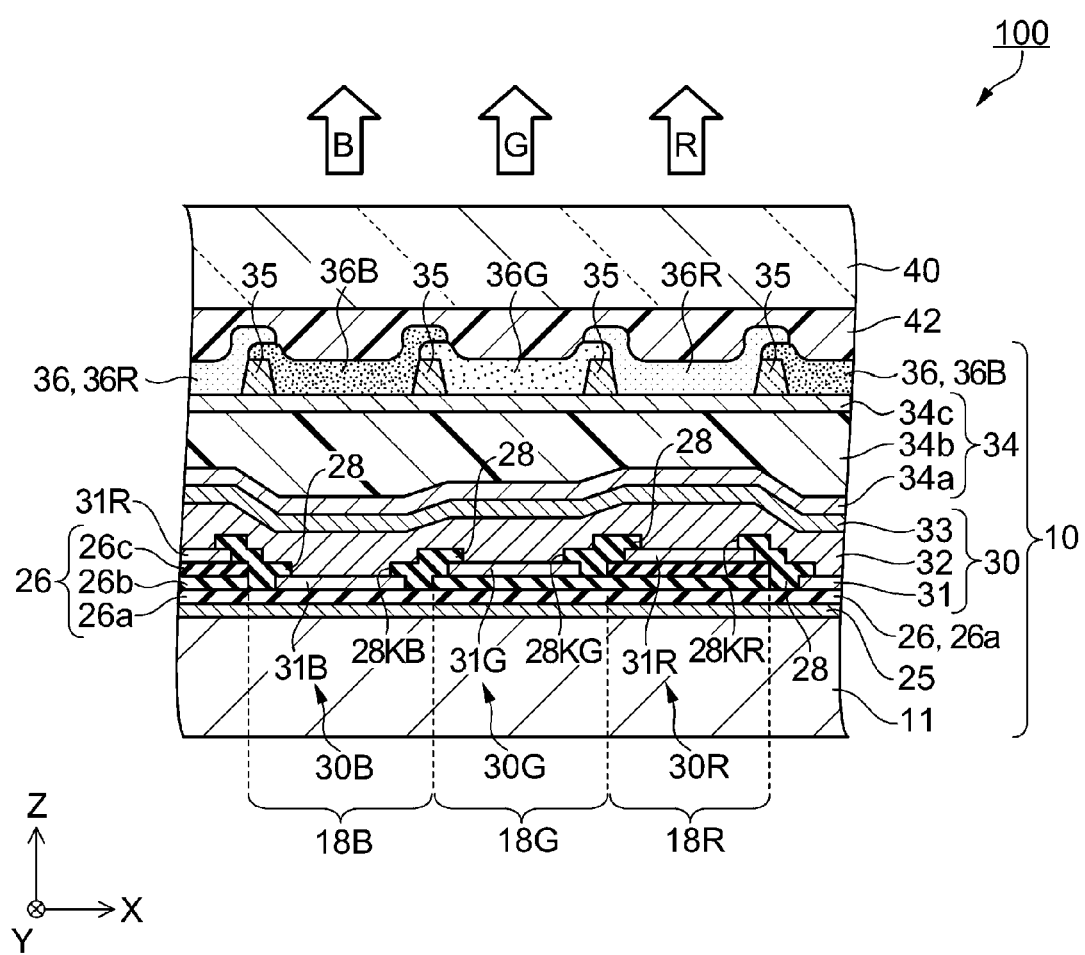
FIG. 4 is a schematic cross-sectional view illustrating a configuration of the sub pixel taken along line IV-IV in FIG. 3.

First, an organic EL device as an electro-optical device according to a first embodiment will be described with reference to FIG. 1 to FIG. 4. FIG. 1 is a schematic plan view illustrating a configuration of the organic EL device according to the first embodiment. FIG. 2 is an equivalent circuit diagram illustrating an electrical configuration of the organic EL device according to the first embodiment. FIG. 3 is a schematic plan view illustrating disposition of the organic EL element and a color filter in a sub pixel. FIG. 4 is a schematic cross-sectional view illustrating a configuration of the sub pixel taken along line IV-IV in FIG. 3. An organic EL device 100 according to the present embodiment is a self-luminous type microdisplay appropriate to a display unit of a head mount display (HMD) to be described below.

As shown in FIG. 1, the organic EL device 100 according to the preset embodiment includes an element substrate 10 and a protective substrate 40. Both substrates are disposed to face each other and adhered through a filler (see FIG. 4).

The element substrate 10 includes a display area E as a first area and a non-display area F as a second area surrounding the display area E. In the display area E, a sub pixel 18B from which blue (B) light is emitted, a sub pixel 18G from which green (G) light is emitted, and a sub pixel 18R from which red light (R) is emitted are arranged, for example, in a matrix shape. In the organic EL device 100, since a pixel 19 including the sub pixel 18B, the sub pixel 18G, and the sub pixel 18R is a display unit, a full-color display is provided.

Furthermore, in following descriptions, the sub pixel 18B, the sub pixel 18G, and the sub pixel 18R are collectively referred to as a sub pixel 18. The display area E is an area through which light emitted from the sub pixel 18 passes and is the area for light being displayed. The non-display area F is an area through which light emitted from the sub pixel 18 does not pass and is not the area for light being displayed. The organic EL device 100 according to the present embodiment includes a casing unit 101 (see FIG. 6) which has light shielding properties and is provided to cover the non-display area F.

Since the element substrate 10 is larger than the protective substrate 40, a plurality of external connection terminals 103 are arranged along with a first side of the element substrate 10 protruding from the protective substrate 40. A data line driving circuit 15 is provided between the plurality of external connection terminals 103 and the display area E. A scanning line driving circuit 16 is provided between a second side and a third side of the element substrate 10 which are opposite to each other and perpendicular to the first side, and the display area E.

Since the protective substrate 40 is smaller than the element substrate 10, the external connection terminals 103 are disposed to be exposed. The protective substrate 40 is a light transmissive substrate and is made of, for example, a quartz substrate, or a glass substrate, or the like. The protective substrate 40 has a role for protecting the organic EL element 30 such that the organic EL element 30 (see FIG. 2) which is disposed in the sub pixel 18 and described below is not damaged in the display area E, and is disposed at least to face the display area E. In the organic EL device 100 according to the present embodiment, light emitted from the sub pixel 18 is obtained from the protective substrate 40 side and a top emission system is employed.

In the following descriptions, a direction along with the first side in which the external connection terminals 103 is arranged is referred to an X direction and a direction along with the other two sides (the second side, the third side) which are opposite to each other and perpendicular to the first side is referred to a Y direction. A direction facing the protective substrate 40 from the element substrate 10 is referred to a Z direction. Also, viewing along with the Z direction from the protective substrate 40 is referred to as "plan view".

In the display area E according to the present embodiment, disposition where the sub pixel 18 from which luminescence of the same color is obtained is arranged in a column direction (Y direction) and the sub pixel 18 from which luminescence of different color is obtained is disposed in a row direction (X direction), that is, so-called stripe type disposition of the sub pixel 18 is employed. In the sub pixel 18, the organic EL element 30 and a color filter 36

(see FIG. 3 or FIG. 4) are disposed. Configurations of the organic EL element 30 and the color filter 36 will be described in detail.

Furthermore, FIG. 1 shows the disposition of the sub pixels 18B, 18G, and 18R in the display area E, but the disposition of the sub pixel 18 in the row direction (X direction) in this order of B, G, and R is not limited thereto. For example, the sub pixel 18 may be disposed in this order of G, B, and R. Also, the disposition of the sub pixel 18 is not limited to the stripe type and may be a delta type, a bayer type, and a S stripe type. In addition, shapes and sizes of the sub pixels 18B, 18G, and 18R are not limited to be the same.

Electrical Configuration of Organic EL Device

As shown in FIG. 2, the organic EL device 100 includes a scanning line 12 and a data line 13 intersecting with each other, and a power supply line 14 intersecting with the scanning line 12. The scanning line 12 is electrically connected to the scanning line driving circuit 16 and the data line 13 is electrically connected to the data line driving circuit 15. Also, the sub pixel 18 is disposed in an area which is demarcated by the scanning line 12 and the data line 13.

The sub pixel 18 includes the organic EL element 30 and a pixel circuit 20 for controlling a drive of the organic EL element 30. Hereinafter, the organic EL element 30 disposed in the sub pixel 18B is referred to as an organic EL element 30B, the organic EL element 30 disposed in the sub pixel 18G is referred to as an organic EL element 30G, and the organic EL element 30 disposed in the sub pixel 18R is referred to as an organic EL element 30R.

The organic EL element 30 is configured to have a pixel electrode 31, a luminescence functional layer 32, and an opposite electrode 33. The pixel electrode 31 functions as an anode which injects an electron hole into the luminescence functional layer 32. The opposite electrode 33 functions as a cathode which injects an electron into the luminescence functional layer 32. In the luminescence functional layer 32, exciton (state of the electron and the electron hole which are attracted to each other by the electrostatic Coulomb force) is formed by the injected electron hole and electron, then, when exciton disappears (when the electron and the electron hole are recombined), a part of energy is emitted as fluorescence and phosphorescence. In the present embodiment, the luminescence functional layer 32 is formed so as to obtain white luminescence from the luminescence functional layer 32.

The pixel circuit 20 includes a switching transistor 21, a storage capacity 22, and a driving transistor 23. The two transistors 21 and 23 can be configured to have, for example, a n-channel type transistor or a p-channel type transistor.

A gate of the switching transistor 21 is electrically connected to the scanning line 12. A source of the switching transistor 21 is electrically connected to the data line 13. A drain of the switching transistor 21 is electrically connected to a gate of the driving transistor 23.

A drain of the driving transistor 23 is electrically connected to the pixel electrode 31 of the organic EL element 30. A source of the driving transistor 23 is electrically connected to the power supply line 14. The storage capacity 22 is electrically connected between the gate of the driving transistor 23 and the power supply line 14.

When the scanning line 12 is driven by a control signal provided by the scanning line driving circuit 16 and a state of the switching transistor 21 becomes an ON state, potential is held in the storage capacity 22 through the switching transistor 21 based on an image signal provided by the data line 13. An ON or OFF state of the driving transistor 23 is determined in accordance with the potential of the storage capacity 22, that is, gate potential of the driving transistor 23. Then, when the driving transistor 23 becomes the ON state, current corresponding to amount of the gate potential flows from the power supply line 14 to the organic EL element 30 through the driving transistor 23. The organic EL element 30 emits light at luminance corresponding to the amount of current flowing through the luminescence functional layer 32.

Furthermore, the configuration of the pixel circuit 20 is not limited to have two transistors 21 and 23, and the pixel circuit 20 may be configured to have an additional transistor for control of current flowing through the organic El element 30.

Disposition of Pixel Electrode and Color Filter

Next, disposition of the pixel electrode 31 and the color filter 36 of the organic EL element 30 in the sub pixel 18 will be described with reference to FIG. 3.

As shown in FIG. 3, the pixel electrodes 31 of the organic EL element 30 are respectively disposed in a plurality of the sub pixels 18 disposed in the matrix shape in the X and Y directions. Specifically, the pixel electrode 31B of the organic EL element 30B is disposed in the sub pixel 18B, the pixel electrode 31G of the organic EL element 30G is disposed in the sub pixel 18G, and the pixel electrode 31R of the organic EL element 30R is disposed in the sub pixel 18R, in the X direction. In this configuration, the three sub pixels 18B, 18G, and 18R which are arranged in the X direction are displayed as one pixel 19.

When seen in a plan view, each of the pixel electrodes 31 (31B, 31G, and 31R) is approximately a rectangular shape and a longitudinal direction thereof is disposed along the Y direction. A disposition pitch of the pixel 19 in the X direction is, for example, equal to or less than 10 μm. Thus, a width of each of the sub pixels 18B, 18G, and 18R in the X direction is equal to or less than 3 μm to 4 μm.

An insulation film 28 is formed to cover an outer edge of each of the pixel electrodes 31B, 31G, and 31R. In the insulation film 28, opening portions 28KB, 28KG, and 28KR of the approximately rectangular shapes in the plan view are formed on the pixel electrodes 31B, 31G, and 31R. Each of the pixel electrodes 31B, 31G, and 31R is exposed inside the opening portions 28KB, 28KG, and 28KR. Furthermore, the shapes of the opening portions 28KB, 28KG, and 28KR are not limited to the substantially rectangular and may be, for example, a track shape whose short side is arcuate.

The color filter 36 is disposed in the sub pixels 18B, 18G, and 18R. The color filter 36 is configured to have a coloring layer 36B of blue color (B), a coloring layer 36G of green color (G), and a coloring layer 36R of red color (R). Specifically, the coloring layer 36B is disposed with respect to a plurality of the sub pixels 18B arranged in the Y direction, the coloring layer 36G is disposed with respect to a plurality of the sub pixels 18G arranged in the Y direction, and the coloring layer 36R is disposed with respect to a plurality of the sub pixels 18R arranged in the Y direction.

That is, the coloring layer 36B is disposed in the stripe shape extending in the Y direction so as to overlap the pixel electrode 31B (opening portion 28KB) arranged in the Y direction. The coloring layer 36G is disposed in the stripe shape extending in the Y direction so as to overlap the pixel electrode 31G (opening portion 28KG) arranged in the Y direction. Similarly, the coloring layer 36R is extended in the Y direction and disposed in the stripe shape so as to overlap the pixel electrode 31R (opening portion 28KB) arranged in the Y direction.

In the present embodiment, the coloring layer 36B and the coloring layer 36G are disposed to overlap each other in a boundary between the sub pixel 18B and the sub pixel 18G adjacent to each other in the X direction. The coloring layer 36G and the coloring layer 36R are disposed to overlap each other in a boundary between the sub pixel 18G and the sub pixel 18R adjacent to each other in the X direction. Also, although not shown in the drawings, the coloring layer 36R and the coloring layer 36B are disposed to overlap each other in a boundary between the sub pixel 18R and the sub pixel 18B adjacent to each other in the X direction.

Structure of Sub Pixel

Next, a structure of the sub pixel 18 in the organic EL device 100 will be described with reference to FIG. 4. As shown in FIG. 4, the organic EL device 100 includes the element substrate 10 and the protective substrate 40 which are disposed so as to face each other through a filler 42. The filler 42 may be configured by, for example, epoxy resin and acrylic resin having light transmission properties, or the like for bonding the element substrate 10 and the protective substrate 40.

The element substrate 10 includes a substrate 11 as a substrate in the invention, a reflective layer 25, a light transmission layer 26, the organic EL element 30, a sealing part 34, and the color filter 36 which are sequentially stacked on the substrate 11 in the Z direction.

The substrate 11 is a semiconductor substrate, for example, silicon or the like. The scanning line 12, the data line 13, the power supply line 14, the data line driving circuit 15, the scanning line driving circuit 16, the pixel circuit 20 (the switching transistor 21, the storage capacity 22, and the driving transistor 23), and the like described above are formed in the substrate 11 using known techniques (see FIG. 2). In FIG. 4, a wiring and a circuit configuration thereof will not be illustrated.

Furthermore, the substrate 11 is not limited to the semiconductor substrate such as silicon and may be a substrate such as quartz or glass. In other words, a transistor constituting the pixel circuit 20 may be a MOS type transistor having an active layer on the semiconductor substrate and may be a thin film transistor or a field effect transistor formed on the substrate such as quartz or glass.

The reflective layer 25 is disposed throughout the sub pixels 18B, 18G, and 18R, and light generated from each of the organic EL elements 30B, 30G, and 30R of the sub pixels 18B, 18G, and 18R is reflected by the reflective layer 25. As a material for forming the reflective layer 25, it is preferable to use aluminum or silver or the like which can realize high reflectance.

The light transmission layer 26 is provided on the reflective layer 25. The light transmission layer 26 is configured to have a first insulation film 26a, a second insulation film 26b, and a third insulation film 26c. The first insulation film 26a is disposed throughout the sub pixels 18B, 18G, and 18R on the reflective layer 25. The second insulation film 26b is stacked on the first insulation film 26a and is disposed throughout the sub pixels 18G and 18R. The third insulation film 26c is stacked on the second insulation film 26b and is disposed in the sub pixel 18R.

That is, the light transmission layer 26 of the sub pixel 18B is configured to have the first insulation film 26a, the light transmission layer 26 of the sub pixel 18G is configured to have the first insulation film 26a and the second insulation film 26b, and the light transmission layer 26 of the sub pixel 18R is configured to have the first insulation film 26a, the second insulation film 26b, and the third insulation film 26c.

Thus, a film thickness of the light transmission layer 26 is larger in this order of the sub pixel 18B, the sub pixel 18G, and the sub pixel 18R.

The organic EL element 30 is provided on the light transmission layer 26. The organic EL element 30 includes the pixel electrode 31, the luminescence functional layer 32, and the opposite electrode 33 which are sequentially stacked in the Z direction. The pixel electrode 31 is formed of a transparent conductive film, for example, indium tin oxide (ITO) film and is formed in an island shape for each of the sub pixels 18.

The insulation film 28 is disposed to cover a periphery of each of the pixel electrodes 31B, 31G, and 31R. As described above, in the insulation film 28, the opening portion 28KB is formed on the pixel electrode 31B, the opening portion 28KG is formed on the pixel electrode 31G, and the opening portion 28KR is formed on the pixel electrode 31R. The insulating film 28 is made of, for example, silicon oxide or the like.

In parts in which the opening portions 28KB, 28KG, and 28KR are provided, the pixel electrode 31 (31B, 31G, and 31R) is contacted to the luminescence functional layer 32 and the electron hole is supplied from the pixel electrode 31 to the luminescence functional layer 32, thus, the luminescence functional layer 32 emits light. That is, the areas in which the opening portions 28KB, 28KG, and 28KR are provided are luminescence areas in which the luminescence functional layer 32 emits light. In an area in which the insulation film 28 is provided, supplying of the electron hole from the pixel electrode 31 to the luminescence functional layer 32 is controlled, thus, luminescence of the luminescence functional layer 32 is controlled. That is, the areas in which the insulation film 28 is provided are the luminescence areas in which luminescence of the luminescence functional layer 32 is controlled.

The luminescence functional layer 32 is disposed throughout the sub pixels 18B, 18G, and 18R and to cover all of the display area E (see FIG. 1). The luminescence functional layer 32 includes, for example, an electron hole injection layer, an electron hole transport layer, an organic luminescent layer, an electron transport layer, and the like which are sequentially stacked in the Z direction. The organic luminescence layer emits light with a wavelength within a range from blue color to red color. The organic luminescence layer may be configured to have one layer or a plurality of layers including, for example, a blue color luminescence layer, a green color luminescence layer, and a red color luminescence layer, or the blue color luminescence layer and a yellow color luminescence layer in which luminescence with the wavelength within the range of red color (R) or green color (G) is obtained.

The opposite electrode 33 is disposed so as to cover the luminescence functional layer 32. The opposite electrode 33 is made of, for example, alloy of magnesium and silver and the like, and a film thickness thereof is controlled so as to have light transmission properties and photoreflectance.

The sealing part 34 covering the opposite electrode 33 is configured to have a first sealing layer 34a, a planarization layer 34b, and a second sealing layer 34c which are sequentially stacked in the Z direction. The first sealing layer 34a and the second sealing layer 34c are formed using an inorganic material. The inorganic material through which moisture and oxygen and the like hardly passes is, for example, silicon oxide, silicon nitride, silicon oxynitride, aluminum oxide, or the like.

Examples of a method for forming the first sealing layer 34a and the second sealing layer 34c include a vacuum deposition method, an ion plating method, a sputtering method, a CVD method, or the like. It is desirable to employ the vacuum deposition method or the ion plating method in that the organic EL element 30 can not be damaged by a heat or the like. Film thicknesses of the first sealing layer 34a and the second sealing layer 34c are preferably 50 nm to 1000 nm, and more preferably 200 nm to 400 nm such that a crack or the like is less likely to occur during a film formation and light transmission properties is obtained.

The planarization layer 34b has the light transmission properties and can be formed by using, for example, heat or any of the resin material of ultraviolet curable epoxy resin, acrylic resin, urethane resin, silicone resin. Also, the planarization layer 34b may be formed by using a coating type inorganic material (silicon oxide or the like). The planarization layer 34b is formed to be stacked on the first sealing layer 34a covering a plurality of the organic EL elements 30.

The planarization layer 34b covers a defect (pinhole, crack) or a foreign substance to form a substantially flat surface during a film formation of the first sealing layer 34a. Since an unevenness is occurred on the surface of the first sealing layer 34a due to an influence of the light transmission layer 26 of which a film thickness is different from the first sealing layer 34a, it is preferable that the film thickness of the planarization layer 34b be, for example, about 1 µm to 5 µm in order to alleviate the unevenness. Thereby, the color filter 36 formed on the sealing part 34 is less likely to be affected by the unevenness.

A light transmissive convex portion 35 is provided between the sub pixels which are adjacent to each other on the sealing part 34. The convex portion 35 is formed by a photolithography method using a photosensitive resin material having no coloring material. The convex portion 35 is disposed in the stripe shape (streak) extending in the Y direction on the sealing part 34 so as to distinguish each of the coloring layers 36B, 36G, and 36R of the color filter 36 formed on the convex portion 35. The cross sectional shape of the convex portion 35 may be, for example, a trapezoidal shape, and a rectangular shape or the like.

Furthermore, the convex portion 35 is not limited to be disposed in the stripe shape and may be disposed in a cross stripes shape extending in X direction and Y direction so as to surround the opening portions 28KB, 28KG, and 28KR in the pixel electrode 31 of each of the sub pixels 18. A height of the convex portion 35 is preferably lower (smaller) than an average film thickness of the coloring layers 36B, 36G, and 36R described below.

The color filter 36 is formed on the sealing part 34. The color filter 36 is configured to have the coloring layers 36B, 36G, and 36R which formed by the photolithography method using a photosensitive resin material having coloring material of blue (B), green (G), and red (R). That is, main materials of the convex portion 35 and the coloring layers 36B, 36G, and 36R are the same. The coloring layers 36B, 36G, and 36R are formed in response to the sub pixels 18B, 18G, and 18R.

The coloring layers 36B, 36G, and 36R are respectively formed to fill between the convex portions 35 adjacent to each other and to cover at least a part of the convex portion 35, on the sealing part 34. Among the coloring layers 36B, 36G, and 36R, the coloring layers 36 adjacent to each other are formed so that parts of the coloring layers 36 overlap each other.

For example, the coloring layer 36B adjacent to the coloring layer 36G is in contact with a side wall of the convex portion 35 and one edge of the coloring layer 36B overlaps an edge of the coloring layer 36G covering a top part of the convex portion 35. Similarly, the coloring layer 36R adjacent to the coloring layer 36G is in contact with the other side wall of the convex portion 35 and one edge of the coloring layer 36R overlaps an edge of the coloring layer 36G covering a parietal of the convex portion 35.

Although not shown in the drawings, a method of formation of the convex portion 35 and the coloring layers 36B, 36G, and 36R will be described in brief. A photosensitive resin layer is formed by coating and pre-baking a photosensitive resin material having no coloring material on the sealing part 34 using a spin coating method as the method of the formation of the convex portion 35. The photosensitive resin material may be a negative type or a positive type. The convex portion 35 is formed on the sealing part 34 by exposing and developing the photosensitive resin layer using the photolithography method.

After a photosensitive resin layer is formed by coating a photosensitive resin material having a coloring material of each color using a spin coating method in the same manner as the convex portion 35, the coloring layers 36B, 36G, and 36R are formed by exposing and developing the photosensitive resin layer using the photolithography method. In the present embodiment, the coloring layers 36G, 36B, and 36R are formed in this order of the coloring layers 36G, 36B, and 36R.

Thus, the edge of the coloring layer 36G covers the top part of the convex portion 35, one edge of the coloring layer 36G is covered with the edge of the coloring layer 36B, and the other edge of the coloring layer 36G is covered with the edge of the coloring layer 36R. One edge of the coloring layer 36B covers the top part of the convex portion 35, is covered with the edge of the coloring layer 36R, and the other edge of the coloring layer 36B covers the edge of the coloring layer 36G. One edge of the coloring layer 36R covers the edge of the coloring layer 36G and the other edge of the coloring layer 36R covers the edge of the coloring layer 36B.

Optical Resonance Structure

The organic EL device 100 according to the present embodiment includes an optical resonance structure between the reflective layer 25 and the opposite electrode 33. In the organic EL device 100, light generated from the luminescence functional layer 32 is repeatedly reflected between the reflective layer 25 and the opposite electrode 33, an intensity thereof with a specified wavelength (resonant wavelength) in response to an optical distance between the reflective layer 25 and the opposite electrode 33 is amplified, and is emitted from the protective substrate 40 in the Z direction as light for a display.

In the present embodiment, the light transmission layer 26 functions as an adjuster for the optical distance between the reflective layer 25 and the opposite electrode 33. As described above, the film thickness of the light transmission layer 26 is larger in this order of the sub pixel 18B, the sub pixel 18G, and the sub pixel 18R. As a result, the optical distance between the reflective layer 25 and the opposite electrode 33 is larger in this order of the sub pixel 18B, the sub pixel 18G, and the sub pixel 18R. Furthermore, the optical distance can be expressed by a sum of products of a refractive index and a film thickness of each of the layers between the reflective layer 25 and the opposite electrode 33.

For example, a film thickness of the light transmission layer 26 is set in the sub pixel 18B such that the resonant wavelength (peak wavelength when luminance is maximum) is 470 nm. A film thickness of the light transmission layer 26 is set in the sub pixel 18G such that the resonant wavelength is 540 nm. A film thickness of the light transmission layer 26 is set in the sub pixel 18R such that the resonant wavelength is 610 nm.

As a result, blue light (B) with the peak wavelength of 470 nm is emitted from the sub pixel 18B, green light (G) with the peak wavelength of 540 nm is emitted from the sub pixel 18G, and red light (R) with the peak wavelength of 610 nm is emitted from the sub pixel 18R. In other words, the organic EL device 100 includes the optical resonance structure in which the intensity of light with the specified wavelength is amplified, obtains a blue light component from white light emitted from the luminescence functional layer 32 in the sub pixel 18B, obtains a green light component from white light emitted from the luminescence functional layer 32 in the sub pixel 18G, and obtains a red light component from white light emitted from the luminescence functional layer 32 in the sub pixel 18R.

Furthermore, the optical distance between the reflective layer 25 and the opposite electrode 33 may be adjusted by varying the thicknesses of the pixel electrode (31B, 31G, and 31R) from each other instead of the light transmission layer 26.

The color filter 36 is disposed on the sealing part 34 in the sub pixels 18B, 18G, and 18R. The coloring layer 36B is disposed through the sealing part 34 on the organic EL element 30B of the sub pixel 18B. Thus, color purity of blue light (B) is enhanced by the light with the peak wavelength of 470 nm passing through the coloring layer 36B. Similarly, the coloring layer 36G is disposed through the sealing part 34 on the organic EL element 30G of the sub pixel 18G and the coloring layer 36R is disposed through the sealing part 34 on the organic EL element 30R of the sub pixel 18R. Thus, color purity of light is enhanced by the green light (G) with the peak wavelength of 540 nm passing through the coloring layer 36G and color purity of light is enhanced by the red light (R) with the peak wavelength of 610 nm passing through the coloring layer 36R.

As described above, in the case where the organic EL element 30 includes the optical resonant structure, light generated from the organic EL element 30 is light emitted from the opposite electrode 33 to the sealing part 34 side, and is light with spectrum different from light generated inside the luminescence functional layer 32.

On the other hand, in boundaries of the sub pixels 18 in which the convex portion 35 is disposed, luminance is decreased by blue light (B) passing through the coloring layer 36R or the coloring layer 36G, luminance is decreased by green light (G) passing through the coloring layer 36B or the coloring layer 36R, and luminance is decreased by red light (R) passing through the coloring layer 36G or the coloring layer 36B.

Also, light generated from the organic EL element 30B of the sub pixel 18B passes through the coloring layer 36B and is shielded by the coloring layer 36G of green color or the coloring layer 36R of red color. Similarly, light generated from the organic EL element 30G of the sub pixel 18G passes through the coloring layer 36G of green color and is shielded by the coloring layer 36B of blue color or the coloring layer 36R of red color. Light generated from the organic EL element 30R of the sub pixel 18R passes through the coloring layer 36R of red color and is shielded by the coloring layer 36B of blue color or the coloring layer 36G of green color. Thus, a direction of light obtained from the organic EL device 100 is defined according to a position of each of the organic EL elements 30 and a position of each of the coloring layers of the color filter 36.

As above, in the organic El device 100, it is required to increase an accuracy of dimensions and positions of the coloring layers 36B, 36G, and 36R constituting the color filter 36 in order to enhance the color purity of light generated from each of the sub pixels 18B, 18G, and 18R and to obtain good viewing angle characteristics. Also, the same applies to the convex portion 35 which distinguishes each of the coloring layers 36B, 36G, and 36R.

Dimension Evaluation Pattern

The organic EL device 100 according to the present embodiment includes an evaluation pattern so as to evaluate the color filter 36. The organic EL device 100 according to the first embodiment includes the dimension evaluation pattern so as to evaluate dimensional accuracy of the color filter 36 as the evaluation pattern.

Example 1

Figure 5A:
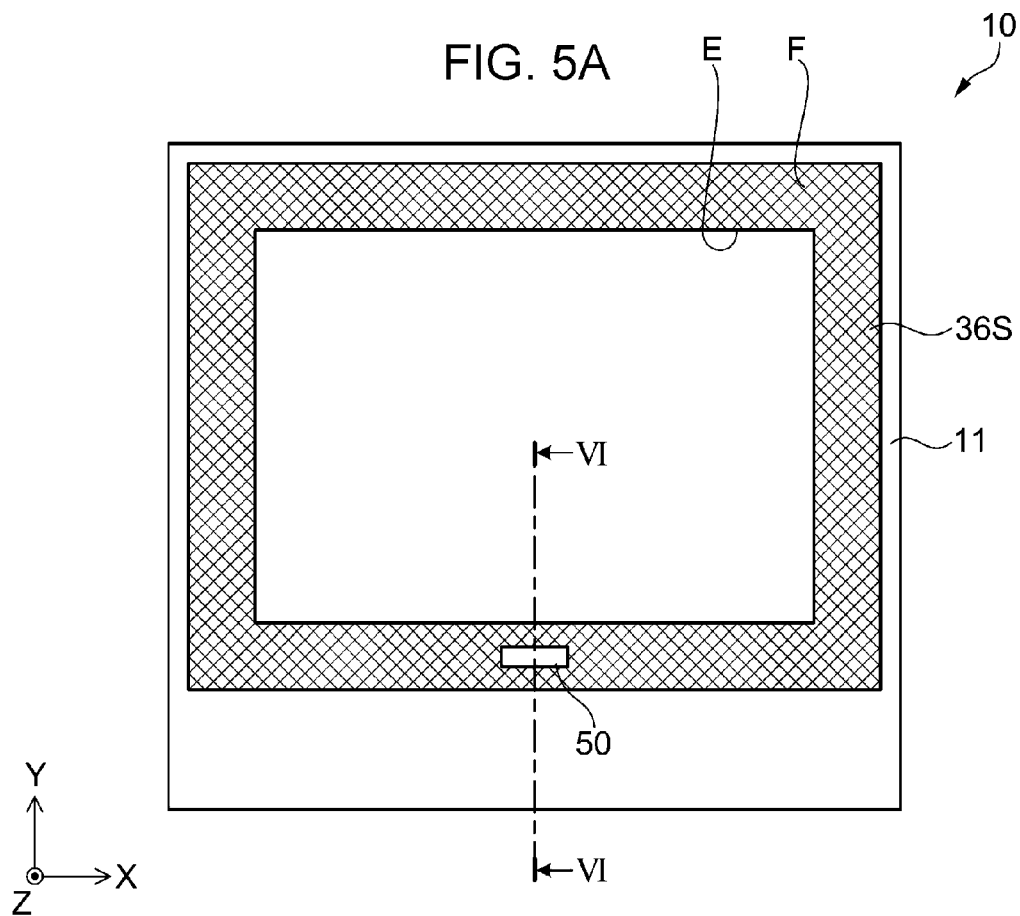
FIG. 5A is a schematic plan view of an element substrate showing disposition of a dimension evaluation pattern according to Example 1.
Figure 5B:
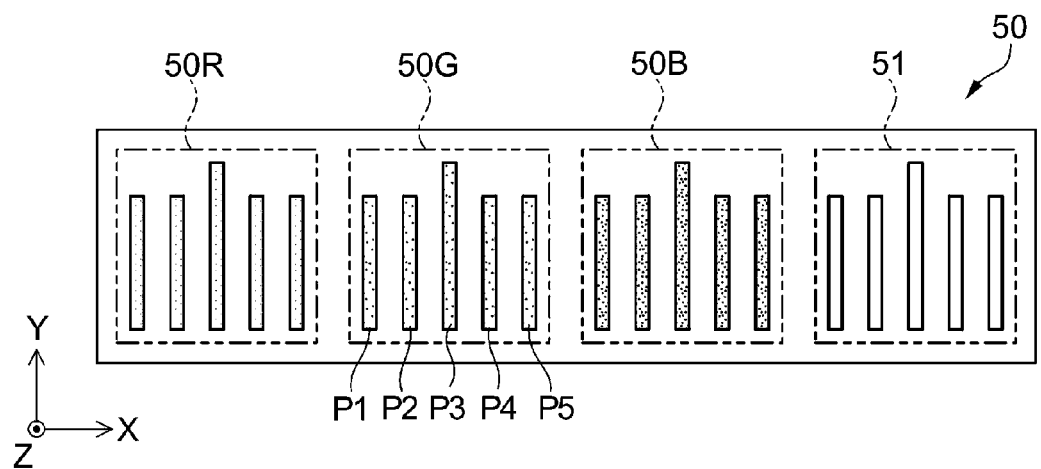
FIG. 5B is a schematic plan view illustrating the enlarged dimension evaluation pattern.
Figure 14:
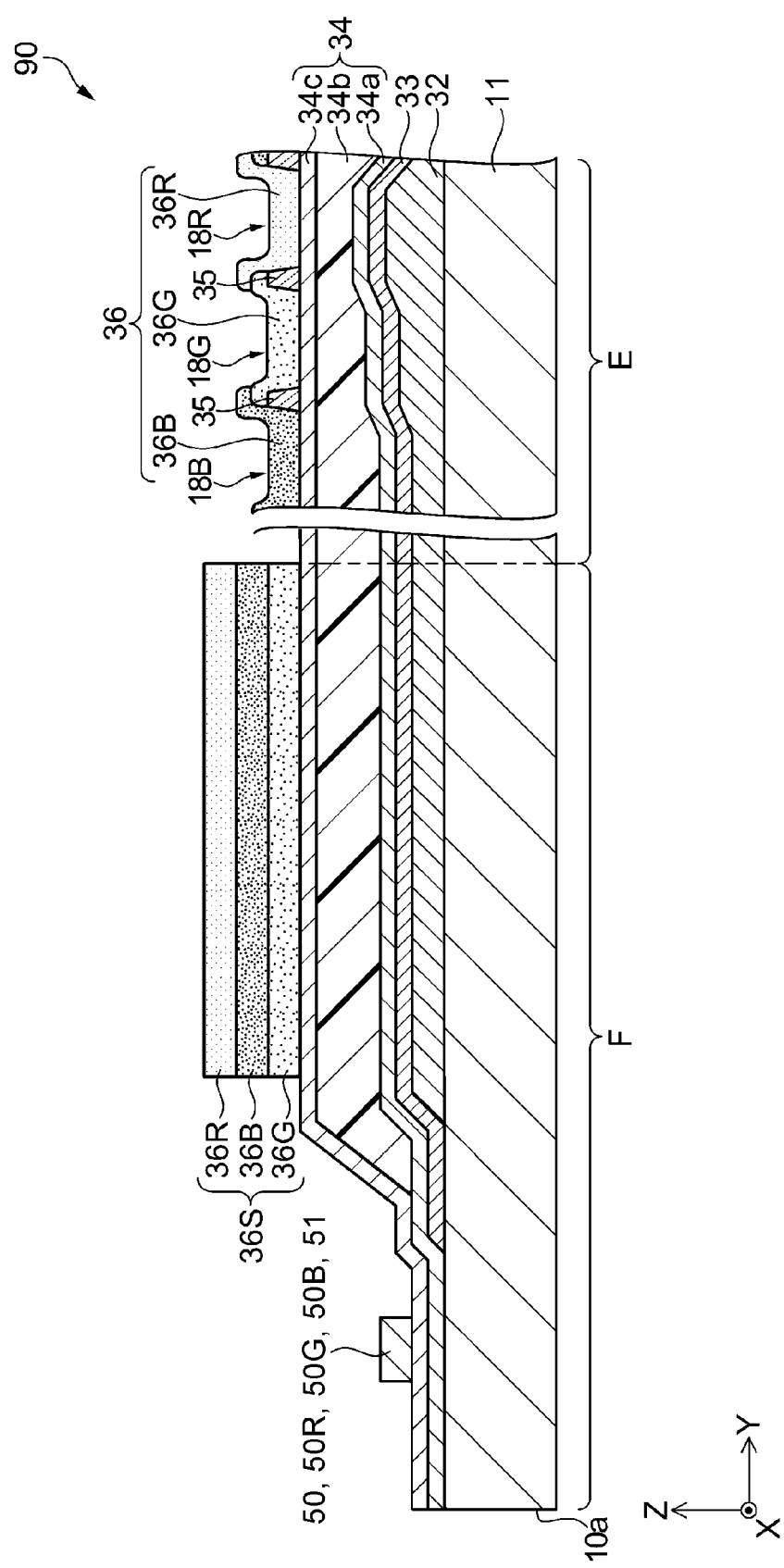
FIG. 14 is a schematic cross-sectional view illustrating disposition of a dimension evaluation pattern according to a comparative example.

First, Example 1 of the evaluation pattern according to the present embodiment will be described with reference to FIG. 5A, FIG. 5B, and FIG. 6. FIG. 5A is a schematic plan view of an element substrate showing disposition of a dimension evaluation pattern according to Example 1. FIG. 5B is a schematic plan view illustrating the enlarged dimension evaluation pattern. FIG. 6 is a schematic cross-sectional view illustrating disposition of the dimension evaluation pattern taken along line VI-VI in FIG. 5A. FIG. 14 is a schematic cross-sectional view of the element substrate illustrating disposition of a dimension evaluation pattern according to a comparative example.

FIG. 5A is a diagram when the element substrate 10 on which the layers up to the color filter 36 (see FIG. 4) are formed is seen in a plan view. As shown in FIG. 5A, a color filter light shielding unit (hereinafter, referred to as CF light shielding unit) 36S is disposed in the non-display area F of the element substrate 10. The CF light shielding unit 36S is provided in a frame shape so as to surround the outer edge of the display area E when seen in a plan view.

As shown in FIG. 6, the CF light shielding unit 36S is configured to have the coloring layers 36B, 36G, and 36R which are stacked. The CF light shielding unit 36S functions as a light shielding unit such that luminance of each of blue light (B), green light (G), and red light (R) passing through the stacked coloring layers 36B, 36G, and 36R is decreased. The CF light shielding unit 36S is covered with the casing unit 101 in a state where the organic EL device 100 is completed.

In the organic EL device 100 including the organic EL element 30, there is a case where light generated by the organic El element 30 is reflected inside the element substrate 10 or the protective substrate 40 (interface between the substrate and an air) and is propagated in a horizontal direction (direction along the substrate surface), and becomes stray light. When such stray light is leaked and visible to the outside, display quality of the organic EL device 100 is decreased. The CF light shielding unit 36S and the casing unit 101 prevent the stray light from leaking to the outside.

As shown in FIG. 5A, a dimension evaluation pattern 50 according to Example 1 is disposed near the display area E in the non-display area F. More specifically, the dimension evaluation pattern 50 is disposed in one side portion of the first side in which the external connection terminal 103 (see FIG. 1) is provided in the CF light shielding unit 36S provided so as to surround an outer edge of the display area E. In the first side of the -Y direction side of the CF light shielding unit 36S, the dimension evaluation pattern 50 is disposed at a substantially central portion in the X direction which is the longitudinal direction thereof and a substantially central portion in the Y direction which is a width direction thereof.

The dimension evaluation pattern 50 functions as a so-called test element group (TEG). In the present embodiment, the dimension evaluation pattern 50 is to evaluate dimensional accuracy of each of the coloring layers 36B, 36G, and 36R of the color filter 36. The dimensional accuracy referred to herein includes, for example, management characteristics of a dimension (width), a shape, a film thickness, and the like of each of the coloring layers 36B, 36G, and 36R.

As shown in FIG. 5B, the dimension evaluation pattern 50 is configured to have a pattern group 50R, a pattern group 50G, a pattern group 50B, and a pattern group 51. The pattern groups 50R, 50G, and 50B include a plurality of patterns P1, P2, P3, P4, and P5 which are formed by the same photosensitive resin material as the coloring layers 36B, 36G, and 36R of the color filter 36. The pattern group 51 includes the plurality of patterns P1, P2, P3, P4, and P5 which are formed by the same photosensitive resin material as the convex portion 35.

Although the patterns P1, P2, P3, P4, and P5 are formed in the stripe shape extending in the Y direction in the same manner as the coloring layers 36B, 36G, and 36R, the patterns adjacent to each other are formed to be apart from each other and the convex portion 35 is not provided therebetween. This point is different from each of the coloring layers 36B, 36G, and 36R of the color filter 36 in which a part (edge) thereof is formed so as to overlap each other.

As described above, each of the coloring layers 36B, 36G, and 36R of the color filter 36 is formed so as to cover the convex portion 35 and to overlap the edges of the coloring layers adjacent to each other. For this reason, it is difficult to accurately measure the dimension (width), the shape, the film thickness, and the like of each of the coloring layers 36B, 36G, and 36R and the convex portion 35 in a manufacturing process of the color filter 36.

Therefore, the dimension evaluation pattern 50 is formed by the same photosensitive resin material as the coloring layers 36B, 36G, and 36R, and the convex portion 35, aside from the color filter 36 in the manufacturing process of the color filter 36. Thus, the pattern groups 50R, 50G, 50B, and 51 (each of the patterns P1, P2, P3, P4, and P5) constituting the dimension evaluation pattern 50 are formed by the same material and the manufacturing process as the coloring layers 36B, 36G, and 36R, and the convex portion 35.

For this reason, when the dimension evaluation pattern 50 is measured, states of the dimension, the shape, the film thickness, and the like of each of the coloring layers 36B, 36G, and 36R, and the convex portion 35 can be obtained. A width (size in the X direction) of each of the patterns P1, P2, P3, P4, and P5 is within two times a width of each of the coloring layers 36B, 36G, and 36R of the color filter 36. It is preferable that the width of each of the patterns P1, P2, P3, P4, and P5 be the same width as each of the coloring layers 36B, 36G, and 36R of the color filter 36.

Among the patterns P1, P2, P3, P4, and P5, the pattern P3 which is disposed in the center in the X direction is a pattern as an original measurement target. When only one pattern corresponding to each of the coloring layers 36B, 36G, and 36R is provided, the shape of the pattern is distorted (deformed) or disappears by being affected by an ambient in the process of exposure and development. For this reason, since the pattern P3 as the measurement target is disposed between the patterns P1, P2 and the patterns P4, P5, the pattern P3 is hardly affected by the ambient and is prevented from deformation or disappearing in the exposure and the development.

Among the patterns P1, P2, P3, P4, and P5, the pattern P3 which is disposed in the center in the X direction is different from the other patterns P1, P2, P4, and P5 which are disposed in both sides of the pattern P3. More specifically, a length (size in the Y direction) of the pattern P3 is longer than the patterns P1, P2, P4, and P5 disposed in both sides of the pattern P3. Accordingly, among the patterns P1, P2, P3, P4, and P5, the pattern P3 can be easily identified as the measurement target.

The dimension evaluation pattern 50 (pattern groups 50R, 50G, 50B, and 51) is light transmissive. For this reason, the dimension evaluation pattern 50 is disposed in the first side in the CF light shielding unit 36S provided on the non-display area F so as not to hinder light passing through the display area E.

As shown in FIG. 6, the sealing part 34 is formed over the display area E and the non-display area F which is disposed on an outside of the display area E. However, since in the non-display area F, the layers of a lower side, for example, the light transmission layer 26 (see FIG. 4), the luminescence functional layer 32, and the like are not formed up to an end portion 10*a* of the element substrate 10, the planarization layer 34*b* for alleviating the unevenness of the lower layer among the sealing part 34 (first sealing layer 34*a*, planarization layer 34*b*, and second sealing layer 34*c*) is not formed up to the end portion 10*a* of the element substrate 10.

The CF light shielding unit 36S is formed in a periphery of the display area E and is disposed on the sealing part 34 including the three layers of the first sealing layer 34*a*, the planarization layer 34*b*, and the second sealing layer 34*c*. Thus, the dimension evaluation pattern 50 is provided in the substantially central portion in the first side of the −Y direction side of the CF light shielding unit 36S and is disposed on the sealing part 34 including the three layers of the first sealing layer 34*a*, the planarization layer 34*b*, and the second sealing layer 34*c*.

By the way, generally, when an evaluation element (TEG) is provided in a semiconductor element such as LSI or the like, there are many cases where the evaluation element is disposed in the vicinity of a scribe line for fragmentation in chip unit from a mother substrate (wafer). For example, as an element substrate 90 of the comparative example shown in FIG. 14, a case where the dimension evaluation pattern 50 of the present embodiment is disposed near the end portion 10*a* of the element substrate 10 is considered. FIG. 14 is a schematic cross-sectional view illustrating disposition of a dimension evaluation pattern according to the comparative example.

In the comparative example shown in FIG. 14, the dimension evaluation pattern 50 is disposed at the end portion 10*a* side (−Y direction side) of the element substrate 10 than the CF light shielding unit 36S in the non-display area F, that is, at a position away from the display area E. For this reason, the differences of the dimension and shape of the dimension evaluation pattern 50 formed at the end portion 10*a* side between the color filter 36 formed on the display area E are likely to occur as compared with a case where the dimension evaluation pattern 50 is formed near the display area E.

Also, in the comparative example shown in FIG. 14, the dimension evaluation pattern 50 is disposed at an area in which the planarization layer 34*b* is not disposed on the −Y direction side than the CF light shielding unit 36S. Thus, a height of the sealing part 34 on which the dimension evaluation pattern 50 is disposed from the substrate 11 is lower than a height of the sealing part 34 on which the color filter 36 is disposed from the substrate 11.

Then, since the positions (distances) from the focal point of exposure equipment are different between the color filter 36 and the dimension evaluation pattern 50, the dimension evaluation pattern 50 is not formed well and the differences of the dimensions and the shapes between the formed color filter 36 and the formed dimension evaluation pattern 50 are likely to occur in the manufacturing process of the color filter 36. As a result, it is difficult to accurately recognize the dimension and the shape of the color filter 36 by measuring the dimension evaluation pattern 50.

As shown in FIG. 6, in the present embodiment, the dimension evaluation pattern 50 is provided in one side part of the CF light shielding unit 36S, thus, the dimension evaluation pattern 50 is disposed at a position near the display area E. Thus, as compared with the comparative example shown in FIG. 14, the dimension evaluation pattern 50 can be formed in more similar accuracy as the color filter 36. For this reason, the differences of the dimensions and the shapes between the dimension evaluation pattern 50 and the color filter 36 are less likely to occur.

Then, the dimension evaluation pattern 50 is disposed on the sealing part 34 in which the first sealing layer 34a, the planarization layer 34b, and the second sealing layer 34c are stacked in the same manner as the color filter 36. Thus, a height of the sealing part 34 on which the dimension evaluation pattern 50 is disposed from the substrate 11 is approximately equal to a height of the sealing part 34 on which the color filter 36 is disposed from the substrate 11. For this reason, the color filter 36 and the dimension evaluation pattern 50 are disposed at substantially the same position (distance) from the focal point of exposure equipment in the manufacturing process of the color filter 36.

By these, in the present embodiment, the dimension evaluation pattern 50 can be formed in the same accuracy as the color filter 36. Thus, when the dimension, the shape, the film thickness, and the like of each of the coloring layers 36B, 36G, and 36R constituting the color filter 36 are recognized by measuring the dimension evaluation pattern 50, it is possible to perform a control of these properties more accurately. As a result, since the coloring layers 36B, 36G, and 36R constituting the color filter 36 can be more accurately formed with respect to the organic EL element 30 of each of the sub pixels 18, the organic EL device 100 having excellent display characteristic with good viewing angle characteristics can be provided.

Furthermore, the dimension evaluation pattern 50 is disposed in one side part of the CF light shielding unit 36S, and light passes through this part. However, since the casing unit 101 is disposed so as to cover the dimension evaluation pattern 50 and the CF light shielding unit 36S, light is not visible to the outside of the organic EL device 100.

Example 2

Figure 8:
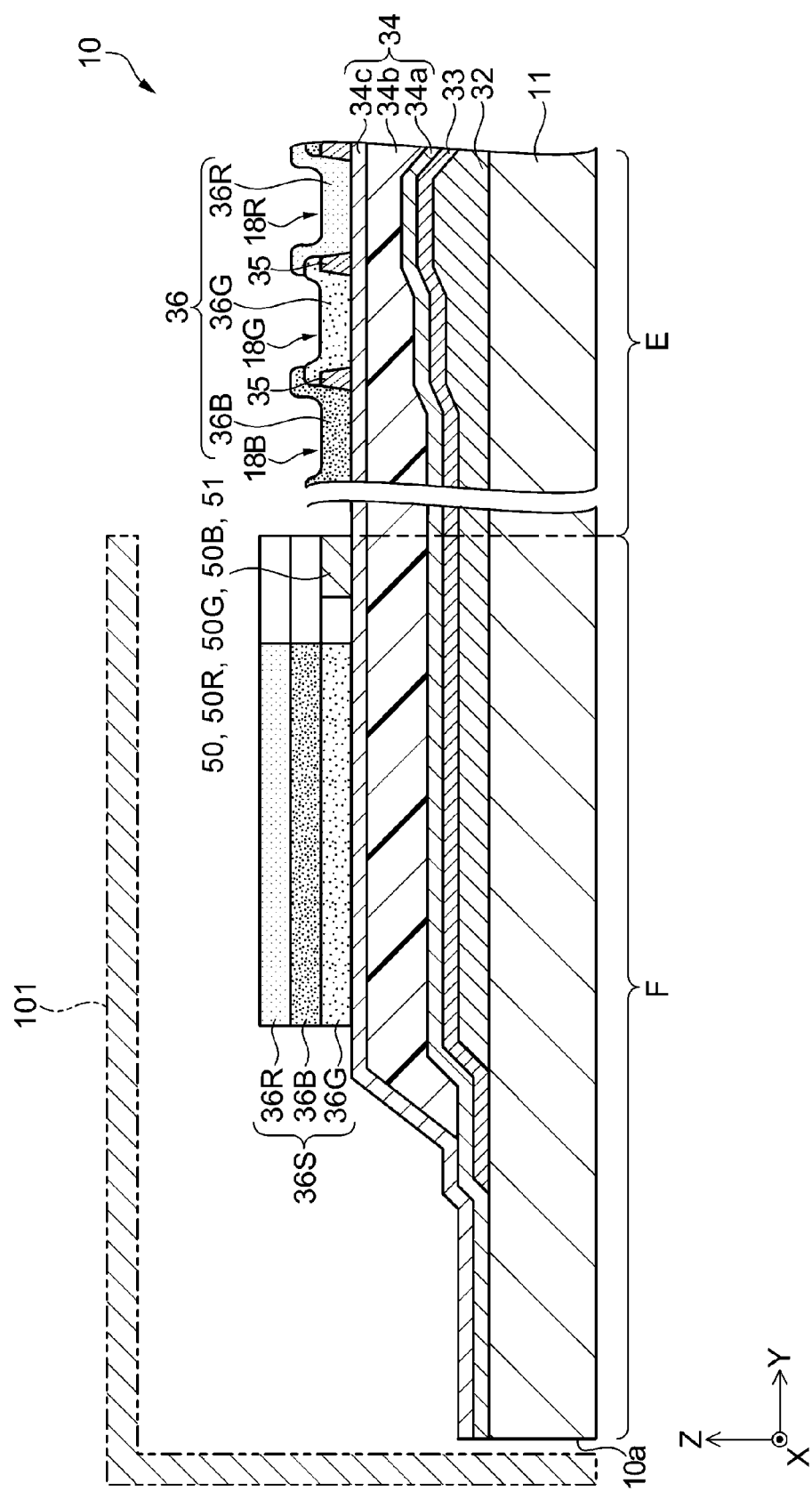
FIG. 8 is a schematic cross-sectional view illustrating disposition of the evaluation pattern taken along line VIII-VIII in FIG. 7.

Subsequently, Example 2 of the evaluation pattern according to the present embodiment will be described with reference to FIG. 7 and FIG. 8. FIG. 7 is a schematic plan view of an element substrate showing disposition of an evaluation pattern according to Example 2. FIG. 8 is a schematic cross-sectional view illustrating disposition of the evaluation pattern taken along line VIII-VIII in FIG. 7. Here, differences with respect to Example 1 will be only described.

As shown in FIG. 7, in Example 2, the dimension evaluation pattern 50 is disposed at a substantially central portion in the longitudinal direction (X direction) of one side of the −Y direction side of the CF light shielding unit 36S and near the display area E in a width direction (Y direction). As shown FIG. 8, also in Example 2, the dimension evaluation pattern 50 is disposed on the sealing part 34 including the three layers of the first sealing layer 34a, the planarization layer 34b, and the second sealing layer 34c. Thus, even in disposition of the dimension evaluation pattern 50 according to Example 2, the same effects as in Example 1 are obtained.

Example 3

Figure 9:
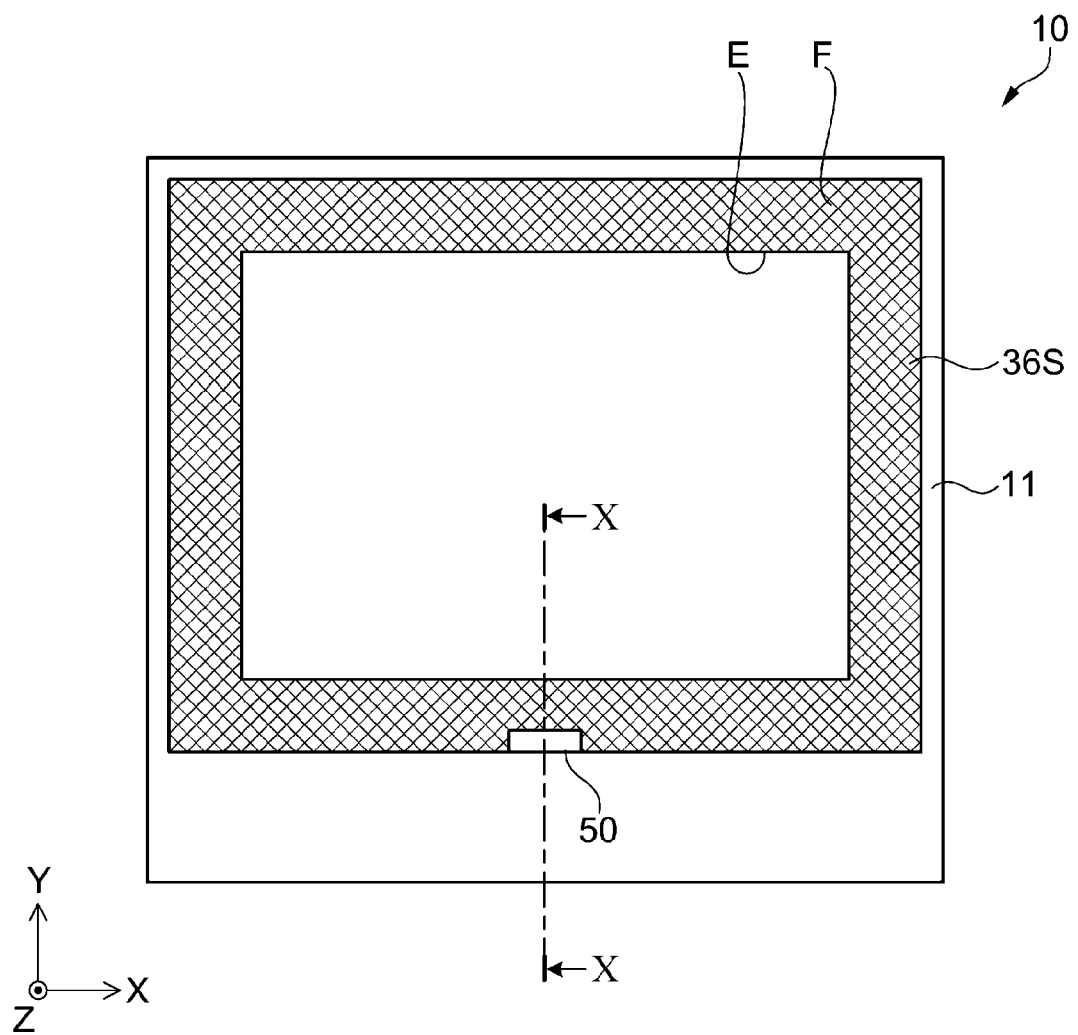
FIG. 9 is a schematic plan view of an element substrate showing disposition of an evaluation pattern according to Example 3.
Figure 10:
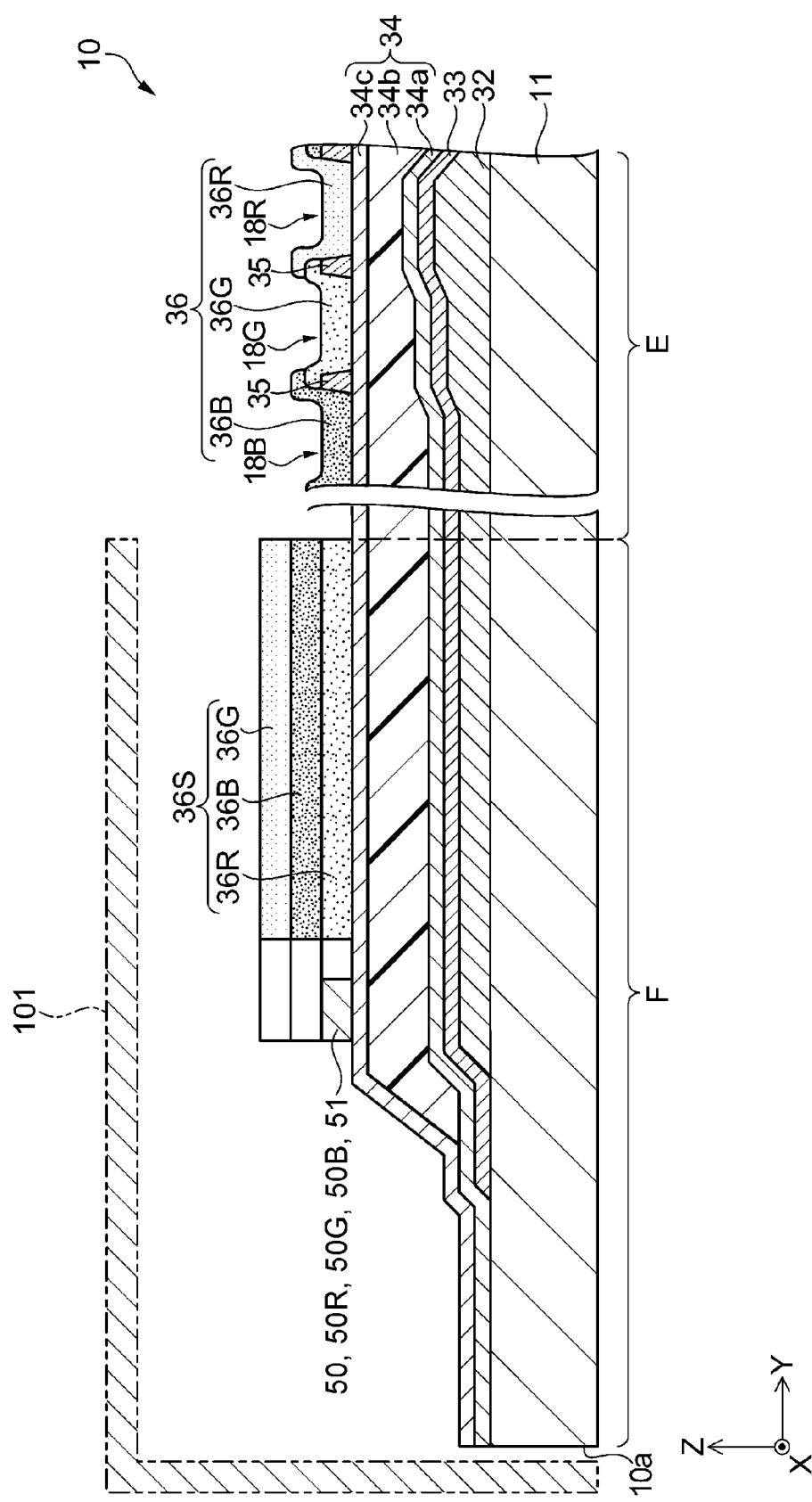
FIG. 10 is a schematic cross-sectional view illustrating disposition of the evaluation pattern taken along line X-X in FIG. 9.

Subsequently, Example 3 of the evaluation pattern according to the present embodiment will be described with reference to FIG. 9 and FIG. 10. FIG. 9 is a schematic plan view of an element substrate showing disposition of an evaluation pattern according to Example 3. FIG. 10 is a schematic cross-sectional view illustrating disposition of the evaluation pattern taken along line X-X in FIG. 9. Here, differences with respect to Example 1 and Example 2 will be only described.

As shown in FIG. 9, in Example 3, the dimension evaluation pattern 50 is disposed at a substantially central portion in the longitudinal direction (X direction) of one side part of the −Y direction side of the CF light shielding unit 36S and near the end portion 10a of the element substrate 10 in the width direction (Y direction). As shown FIG. 10, also in Example 3, the dimension evaluation pattern 50 is disposed on the sealing part 34 including the three layers of the first sealing layer 34a, the planarization layer 34b, and the second sealing layer 34c. Thus, even in the disposition of the dimension evaluation pattern 50 according to Example 3, the same effects as in Example 1 are obtained.

As described above, according to the configuration of the organic EL device 100 according to the first embodiment, following effects can be obtained.

(1) The organic EL device 100 includes the dimension evaluation pattern 50 for evaluating dimensional accuracy of the color filter 36 in addition to the color filter 36 including the coloring layers 36B, 36G, and 36R formed on the sealing part 34 covering the plurality of organic EL elements 30. For this reason, it is possible to perform the control of the dimension of each of the coloring layers 36B, 36G, and 36R more accurately by measuring the dimension evaluation pattern 50 in the manufacturing process of the color filter 36. Accordingly, since the coloring layers 36B, 36G, and 36R constituting the color filter 36 can be more accurately formed with respect to the organic EL element 30, the organic EL device 100 having excellent display characteristic with good viewing angle characteristics can be provided.

(2) Since the dimension evaluation pattern 50 is disposed on the sealing part 34 in the same manner as the color filter 36, the dimension evaluation pattern 50 can be formed in condition more similar to that of the color filter 36 as compared with a case where the dimension evaluation pattern 50 is not formed on the sealing part 34. Also, since the dimension evaluation pattern 50 is disposed in the non-display area F surrounding the display area E in which the organic EL element 30 is disposed, light generated by the organic EL element 30 is emitted without a hindrance of the dimension evaluation pattern 50.

(3) a height of the sealing part 34 on which the dimension evaluation pattern 50 is disposed from the substrate 11 is approximately equal to a height of the sealing part 34 on which the color filter 36 is disposed from the substrate 11. For this reason, for example, since the color filter 36 and the dimension evaluation pattern 50 are disposed at substantially the same position (distance) from the focal point of exposure equipment when each of the coloring layers 36B, 36G, and 36R of the color filter 36 is formed using the photolithography method, the dimension evaluation pattern 50 can be formed in more similar accuracy as the color filter 36. Thus, it is possible to perform the control of the dimension of each of the coloring layers 36B, 36G, and 36R constituting the color filter 36 more accurately by measuring the dimension evaluation pattern 50.

(4) Since the dimension evaluation pattern 50 is disposed at a position near the display area E in which the plurality of organic EL elements 30 are disposed and formed in condition more similar to that of the color filter 36, the differences of the dimensions and the shapes between the dimension evaluation pattern 50 and the color filter 36 are less likely to occur.

(5) Since the color filter 36 is configured to have the coloring layers 36B, 36G, and 36R which are formed to partially overlap each other, it is difficult to measure the dimensions and the positions of the coloring layers 36B, 36G, and 36R. On the other hand, since the dimension evaluation pattern 50 is configured to have the pattern groups 50R, 50G, 50B, and 51 which are formed to be apart from each other, it is possible to measure the dimensions and the positions of the pattern groups 50R, 50G, 50B, and 51 (patterns P1, P2, P3, P4, and P5) constituting the dimension evaluation pattern 50. Thus, even in the case where the coloring layers 36B, 36G, and 36R are formed to overlap each other, it is possible to perform the control of the dimension and the position of the color filter 36 more accurately by measuring the dimension evaluation pattern 50 in the manufacturing process of the color filter 36.

(6) Since the pattern groups 50R, 50G, 50B, and 51 constituting the dimension evaluation pattern 50 include the plurality of patterns P1, P2, P3, P4, and P5, deformation and loss of the pattern P3 are suppressed at the time of exposure and development. Also, since one pattern P3 among the plurality of patterns P1, P2, P3, P4, and P5 is different from other patterns P1, P2, P4, and P5, it is possible to identify the pattern P3 from the plurality of patterns P1, P2, P4, and P5.

(7) Since the dimension evaluation pattern 50 is covered with the casing unit 101, light passing through the dimension evaluation pattern 50 is shielded by the casing unit 101 and is not visible to the outside. Thus, even in the case where the dimension evaluation pattern 50 is provided, the display quality of the organic EL device 100 is not decreased.

Second Embodiment

Organic EL Device

Figure 11A:
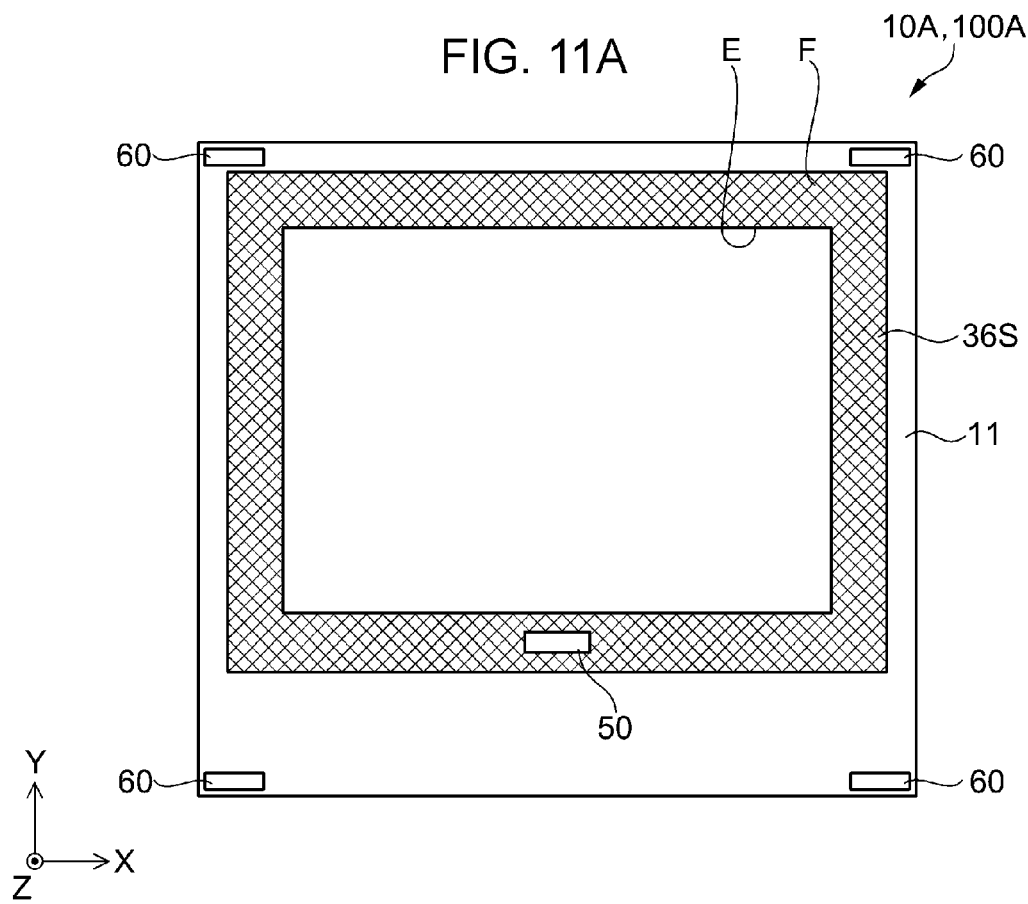
FIG. 11A is a schematic plan view of an element substrate showing disposition of a position evaluation pattern according to a second embodiment.
Figure 11B:
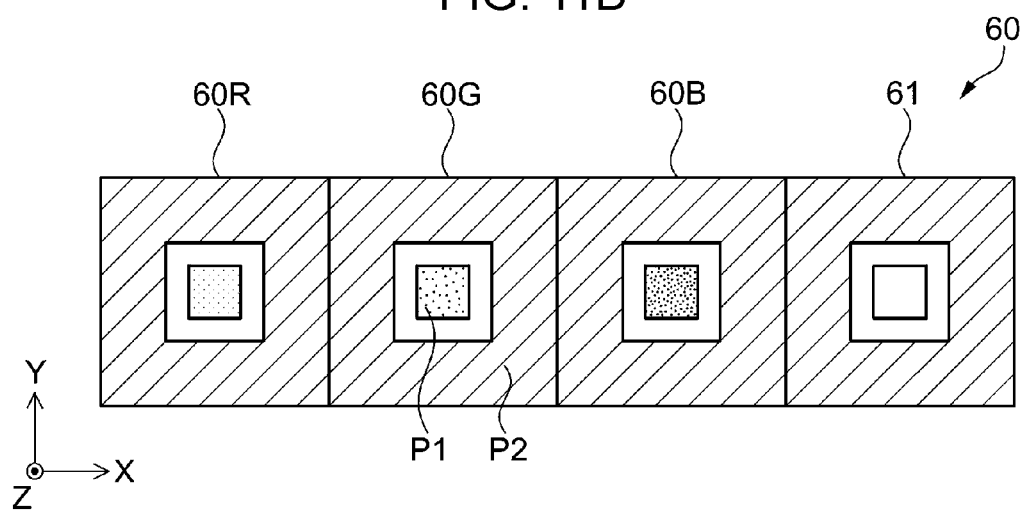
FIG. 11B is a schematic plan view illustrating the enlarged position evaluation pattern according to the second embodiment.

First, the configuration of the organic EL device according to a second embodiment will be described with reference to FIG. 11A and FIG. 11B. FIG. 11A is a schematic plan view illustrating the configuration of the organic EL device according to the second embodiment. FIG. 11A is a schematic plan view of the element substrate showing the disposition of the position evaluation pattern according to the second embodiment. FIG. 11B is a schematic plan view illustrating the enlarged position evaluation pattern according to the second embodiment.

Although an organic EL device 100A according to the second embodiment is different from the organic EL device 100 according to the first embodiment in that the organic EL device 100A further includes a position evaluation pattern 60 for evaluating position accuracy of the color filter 36, the configuration other than the position evaluation pattern 60, that is, the configurations of the organic EL device described with reference to FIG. 1 to FIG. 4 are substantially the same. Here, differences regarding the first embodiment will be only described, components common to the first embodiment are denoted by the same reference numerals, and description thereof will be omitted.

As shown in FIG. 11A, the organic EL device 100A according to the second embodiment includes an element substrate 10A. In the element substrate 10A, the position evaluation pattern 60 for evaluating the position accuracy of the color filter 36 is provided in addition to the dimension evaluation pattern 50 for evaluating the dimensional accuracy of the color filter 36, as the evaluation pattern.

Position Evaluation Pattern

The position evaluation pattern 60 functions as test element group (TEG) in the same manner as the dimension evaluation pattern 50. In the present embodiment, the position evaluation pattern 60 is to evaluate the position accuracy of each of the coloring layers 36B, 36G, and 36R of the color filter 36. The position accuracy referred to herein includes, for example, management characteristics of a positional deviation (such as a shift in a specific direction), a rotation, a magnification deviation, a distortion, and the like of each of the coloring layers 36B, 36G, and 36R.

As shown in FIG. 11A, the position evaluation pattern 60 is disposed at a corner portion of an outer peripheral in the non-display area F of the element substrate 10A. Furthermore, although FIG. 11A shows that the position evaluation pattern 60 is disposed at the four corners of the element substrate 10A, the position evaluation pattern 60 may be disposed in at least one corner of the four corners of the element substrate 10A.

As shown in FIG. 11B, the position evaluation pattern 60 is configured to have a pattern group 60R, a pattern group 60G, a pattern group 60B, and a pattern group 61. The pattern groups 60R, 60G, 60B, and 61 include the pattern P1 formed in a substantially rectangular and the pattern P2 formed in a substantially rectangular frame shape to surround the pattern P1. The pattern P1 and the pattern P2 are apart from each other.

The pattern P1 of the pattern groups 60R, 60G, and 60B is formed by the same photosensitive resin material as the coloring layers 36B, 36G, and 36R of the color filter 36. The pattern P1 of the pattern group 61 is formed by the same photosensitive resin material as the convex portion 35. The patterns P1 of the pattern groups 60R, 60G, 60B, and 61 are formed in the manufacturing process of the color filter 36.

The pattern P2 of the pattern groups 60R, 60G, 60B, and 61 is formed by, for example, amorphous silicon, polycrystalline silicon, metal materials, silicon nitride, and the like. The patterns P2 of the pattern groups 60R, 60G, 60B, and 61 are formed in a process before the manufacturing process of the color filter 36.

The position evaluation pattern 60 can measure whether or not there is the positional deviation of the pattern P1 on the basis of the pattern P2 in each of the pattern groups 60R, 60G, 60B, and 61. That is, it is possible to know whether or not there is the positional deviation of the pattern P1 on the basis of the pattern P2 by comparing spaces (distances) between both outer ends in the X direction or both outer ends in the Y direction of the pattern P1 and inner end of the pattern P2. Also, it is possible to know size or direction of the positional deviation in the case where there is the positional deviation. Accordingly, it is possible to know whether or not there is the positional deviation in each of the coloring layers 36B, 36G, and 36R of the color filter 36 and the convex portion 35, and it is possible to know size or direction or the like of the positional deviation in the case where there is the positional deviation.

Figure 12:
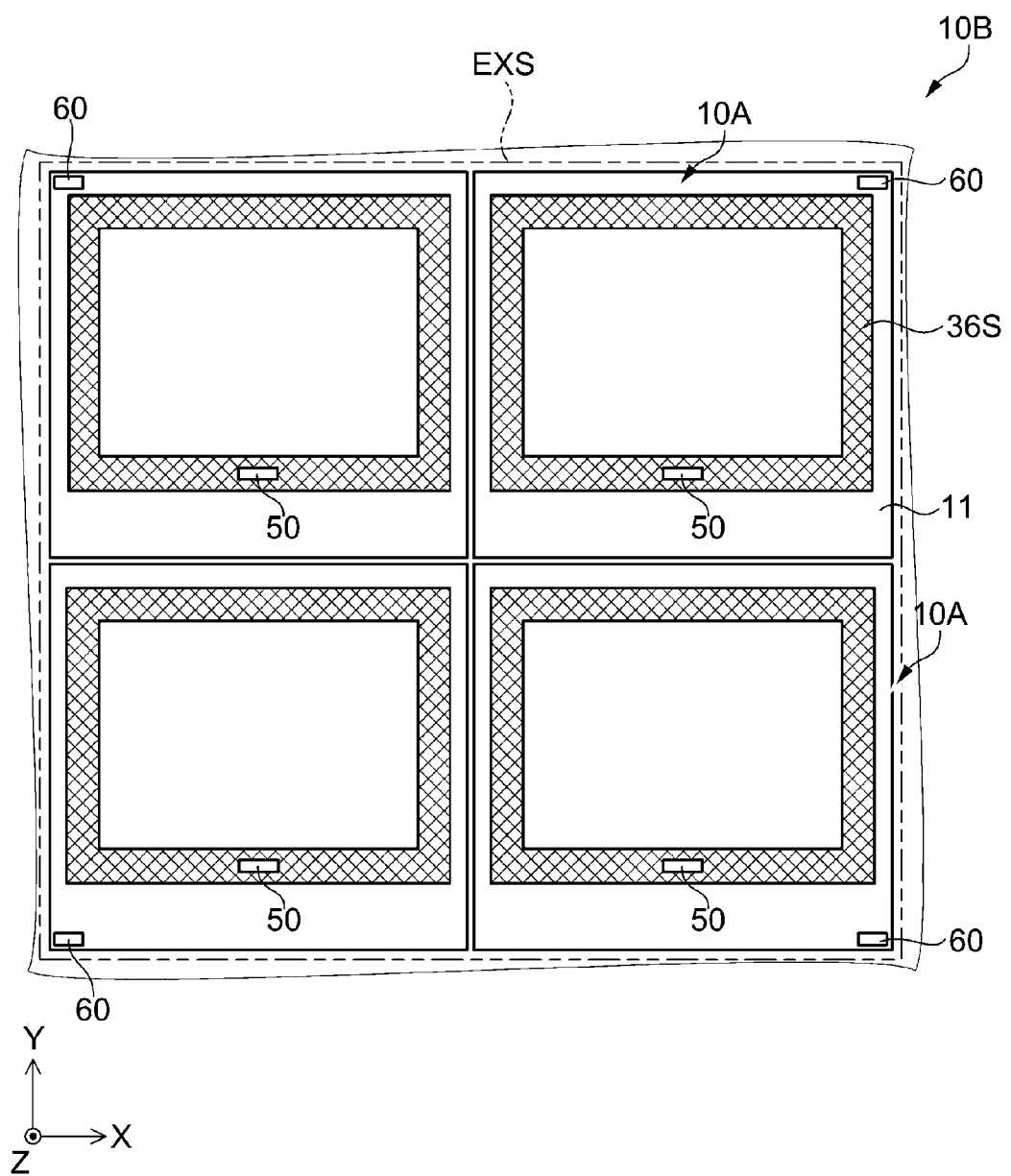
FIG. 12 is a diagram illustrating one example of a shot unit when performing exposure in a manufacturing process of a color filter.

There are many cases where a plurality of the element substrates 10A are exposed at a time as a target by a single shot when performing exposure in the manufacturing process of the color filter. FIG. 12 is a diagram illustrating one example of a shot unit when performing exposure in the manufacturing process of the color filter. FIG. 12 shows a part of a mother substrate (wafer) 10B in which the plurality of element substrates 10A can be provided. In an example shown in FIG. 12, the four element substrates 10A are exposed by a single shot EXS when performing exposure in the manufacturing process of the color filter. For this reason, it is preferable that the position evaluation pattern 60 be disposed at four corners of a shot EXS unit to target the four element substrates 10A for detecting the positional deviation when performing exposure.

It is possible to detect the positional deviation (such as the shift in the specific direction), the rotation, the magnification deviation, the distortion, and the like of an entire plane of the shot EXS when performing exposure, by being disposed the position evaluation pattern 60 at the four corners of a shot EXS unit to target the four element substrates 10A. Then, it is possible to analyze and handle causes that positional deviation occurs by measuring a direction and a size of the positional deviation in each of the four position evaluation patterns 60. Also, it is possible to recognize a status of the positional deviation of an entire inner surface of the wafer by measuring a direction and a size of the positional deviation in each of the position evaluation patterns 60 inside of a surface of the mother substrate 10B.

In the second embodiment, since the position evaluation pattern 60 is provided in addition to the dimension evaluation pattern 50, the dimensional accuracy of each of the coloring layers 36B, 36G, and 36R can be evaluated by measuring the dimension evaluation pattern 50, the position accuracy of each of the coloring layers 36B, 36G, and 36R can be evaluated by measuring the position evaluation pattern 60, and it is possible to perform the control of these properties more accurately. As a result, the coloring layers 36B, 36G, and 36R constituting the color filter 36 can be more accurately formed with respect to the organic EL element 30 of each of the sub pixels 18.

When the position evaluation patterns 60 are formed at the four corners of a shot EXS unit as the example shown in FIG. 12, the position evaluation pattern 60 is disposed at one corner among the four corners shown in FIG. 11A in each of the element substrate 10A which is finally formed.

Furthermore, when the position evaluation pattern 60 is disposed at a corner of an outer periphery of the element substrate 10A, a height of the position evaluation pattern 60 from the substrate 11 is lower than a height of the color filter 36 from the substrate 11. However, an object of the position evaluation pattern 60 is to evaluate the position accuracy of the color filter 36, thus, it is preferable that the position evaluation pattern 60 be disposed in the corner portion of the outer peripheral of the color filter 36.

As described above, according to the configuration of the organic EL device 100A according to the second embodiment, following effects can be obtained in addition to the effects of the first embodiment.

(8) The dimensional accuracy of each of the coloring layers 36B, 36G, and 36R can be measured by the dimension evaluation pattern 50 and the position accuracy of each of the coloring layers 36B, 36G, and 36R can be measured by the position evaluation pattern 60. Accordingly, it is possible to perform the control of the dimension and the position of each of the coloring layers 36B, 36G, and 36R more accurately in the manufacturing process of the color filter 36.

(9) Since the pattern P1 and the pattern P2 of the pattern groups 60R, 60G, 60B, and 61 are different from each other, it is possible to recognize the position deviation of each of the coloring layers 36B, 36G, and 36R by comparing the pattern P1 and the pattern P2.

Third Embodiment

Electronic Apparatus

Figure 13:
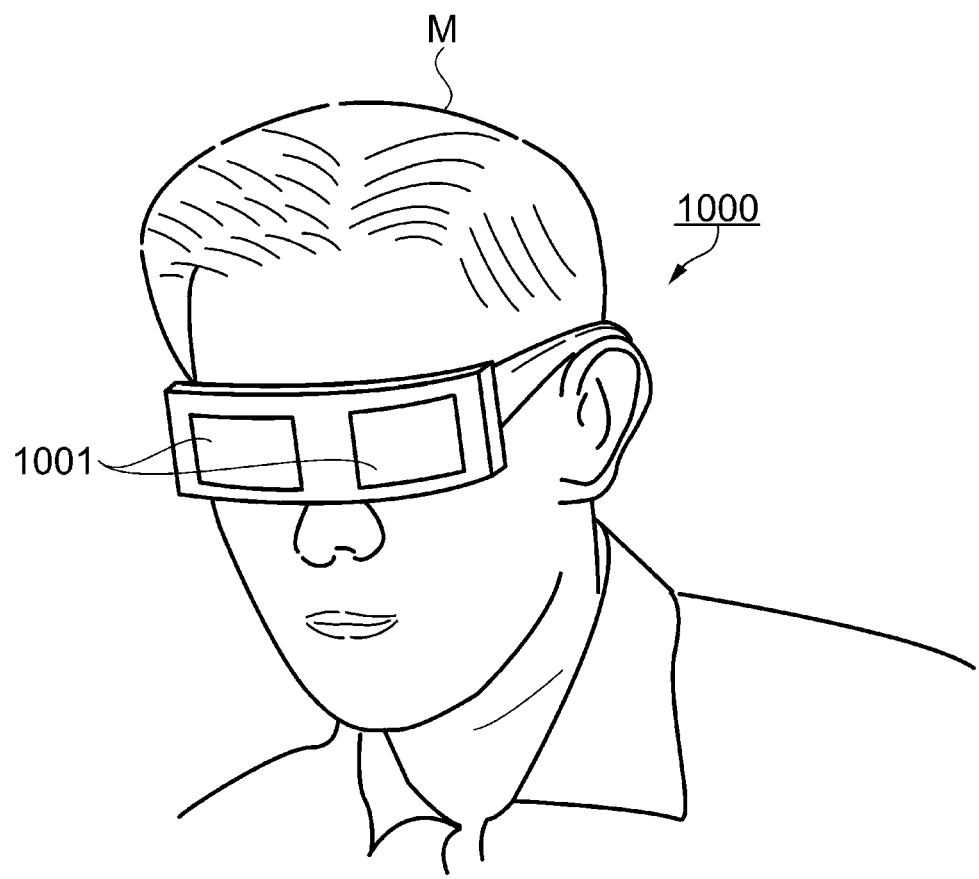
FIG. 13 is a schematic view illustrating a configuration of a head mount display as an electronic apparatus according to a third embodiment.

Next, an electronic apparatus according to a third embodiment will be described with reference to FIG. 13. FIG. 13 is a schematic view illustrating a configuration of a head mount display as the electronic apparatus according to the third embodiment.

As shown in FIG. 13, the head mount display (HMD) 1000 according to the third embodiment includes the two display units 1001 provided corresponding to right and left eyes. An observer M can see characters and images which are displayed on the display unit 1001 by mounting the head mount display 1000 on a head as glasses. For example, when images in consideration of binocular parallax are displayed on the display units 1001 of right and left, the observer can see and enjoy stereoscopic images.

The organic EL device 100 according to the first embodiment or the organic EL device 100A according to the second embodiment is mounted on the display unit 1001. Thus, it is possible to provide the small and lightweight head mount display 1000 having the excellent display quality and high color purity in high luminance and the head mount display 1000 is particularly suitable for a head mount display of a see-through type.

The configuration of the head mount display 1000 is not limited to have the two display units 1001, may have the one display unit 1001 corresponding to either the right or left.

Furthermore, the electronic apparatus on which the organic EL device 100 according to the first embodiment or the organic EL device 100A according to the second embodiment is mounted is not limited to the head mount display 1000. The electronic apparatus on which the organic EL device 100 is mounted is, for example, the electronic apparatus having the display unit such as a personal computer, a portable information terminal, a navigator, a viewer, a head-up display, and the like.

Embodiments described above merely show one embodiment of the invention and can be arbitrarily modified and applied within the scope of the invention. As modification examples, for example, the following or the like can be considered.

Modification Example 1

Although, in Example 1, Example 2, and Example 3 according to the first embodiment, the dimension evaluation pattern 50 is disposed at one side of the −Y direction side of the CF light shielding unit 36S, the invention is not limited to these embodiments. The dimension evaluation pattern 50 may be disposed at another side or the plurality of sides. Also, the dimension evaluation pattern 50 may be disposed at a position other than the substantially central portion in the longitudinal direction of one side of the CF light shielding unit 36S. Furthermore, although the dimension evaluation pattern 50 is disposed on the sealing part 34 including the three layers of the first sealing layer 34a, the planarization layer 34b, and the second sealing layer 34c, the dimension evaluation pattern 50 may be disposed at outside (end portion 10a side of element substrate 10) of the CF light shielding unit 36S.

Modification Example 2

Although, in the second embodiment, the patterns P2 of the pattern groups 60R, 60G, and 60B of the position evaluation pattern 60 are formed using material different from the pattern P1 in a process different from the pattern P1, the invention is not limited to these embodiments. The pattern P2 may be formed by the same photosensitive resin material as the convex portion 35 and the pattern P1 may be formed by the same photosensitive resin material as the coloring layers 36B, 36G, and 36R. In these configurations, it is possible to evaluate the position accuracy of each of the coloring layers 36B, 36G, and 36R (pattern P1) on the basis of the position of the convex portion 35 (pattern P2) which is formed before the color filter 36.

Modification Example 3

The luminescence elements provided on the display area E in the organic EL devices 100 and 100A according to the first embodiment and the second embodiment are not limited to the sub pixels 18B, 18G, and 18R corresponding to blue light (B), green light (G), and red light (R). For example, the sub pixel 18Y from which the luminescence of yellow light (Y) is obtained other than above the three colors may be provided. Accordingly, it is possible to further improve color reproducibility. Also, the sub pixels 18 of the two colors among the above three colors may be provided.

The entire disclosure of Japanese Patent Application No. 2016-024504, filed Feb. 12, 2016 is expressly incorporated by reference herein.

What is claimed is:
1. An electro-optical device comprising:
a substrate;
an organic electroluminescence (EL) element that is disposed on the substrate;
a sealing part that is formed to cover the organic EL element;
a color filter that includes a coloring layer formed on the sealing part; and
an evaluation pattern that is measured to evaluate the color filter, the evaluation pattern being disposed on the sealing part.
2. The electro-optical device according to claim 1,
wherein the sealing part is formed over a first area on which the organic EL element is disposed and a second area surrounding the first area,
the color filter is disposed on the sealing part in the first area, and
the evaluation pattern is disposed on the sealing part in the second area.
3. The electro-optical device according to claim 1,
wherein the evaluation pattern includes a dimension evaluation pattern for evaluating dimensional accuracy of the coloring layer.
4. The electro-optical device according to claim 2,
wherein a height of the sealing part from the substrate in the first area is approximately equal to a height of the sealing part from the substrate in the second area.
5. The electro-optical device according to claim 2,
wherein the evaluation pattern is disposed near the first area in the second area.
6. The electro-optical device according to claim 1,
wherein the evaluation pattern includes a position evaluation pattern for evaluating position accuracy of the coloring layer.
7. The electro-optical device according to claim 2,
wherein the position evaluation pattern is disposed at a corner portion of an outer periphery in the second area.
8. The electro-optical device according to claim 1,
wherein the evaluation pattern includes the coloring layers of at least two colors,
the color filter includes the coloring layers of at least two colors,
the coloring layers of at least two colors are formed to partially overlap each other, and
the coloring layers of at least two colors of the evaluation pattern are formed to be apart from each other.
9. The electro-optical device according to claim 8,
wherein the evaluation pattern includes a plurality of patterns for each of the coloring layers.
10. The electro-optical device according to claim 9,
wherein one pattern among the plurality of patterns is different from the other patterns.
11. The electro-optical device according to claim 1, further comprising:
a casing unit that has light shielding properties;
wherein the evaluation pattern is covered with the casing unit.
12. An electronic apparatus comprising:
the electro-optical device according to claim 1.
13. An electronic apparatus comprising:
the electro-optical device according to claim 2.
14. An electronic apparatus comprising:
the electro-optical device according to claim 3.
15. An electronic apparatus comprising:
the electro-optical device according to claim 4.
16. An electronic apparatus comprising:
the electro-optical device according to claim 5.
17. An electronic apparatus comprising:
the electro-optical device according to claim 6.
18. An electronic apparatus comprising:
the electro-optical device according to claim 7.
19. An electronic apparatus comprising:
the electro-optical device according to claim 8.
20. An electronic apparatus comprising:
the electro-optical device according to claim 9.

* * * * *